US010784992B2

(12) United States Patent
Kurmaev et al.

(10) Patent No.: US 10,784,992 B2
(45) Date of Patent: Sep. 22, 2020

(54) DEVICE AND METHOD FOR EXECUTING ENCODING

(71) Applicant: Huawei Technologies Co., Ltd., Shenzhen (CN)

(72) Inventors: Oleg Feat'evich Kurmaev, Moscow (RU); Alexey Mikhailovich Razinkin, Moscow (RU); Vasily Stanislavovich Usatyuk, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/258,051

(22) Filed: Jan. 25, 2019

(65) Prior Publication Data
US 2019/0158222 A1 May 23, 2019

Related U.S. Application Data

(63) Continuation of application No. PCT/RU2016/000488, filed on Jul. 27, 2016.

(51) Int. Cl.
*H04L 12/801* (2013.01)
*H04L 5/14* (2006.01)
(Continued)

(52) U.S. Cl.
CPC .......... *H04L 1/0058* (2013.01); *H03M 13/13* (2013.01); *H03M 13/251* (2013.01);
(Continued)

(58) Field of Classification Search
CPC .............. H04L 1/0058; H04L 1/1614; H03M 13/6356; H03M 13/251; H03M 13/6306; H03M 13/6362
See application file for complete search history.

(56) References Cited

U.S. PATENT DOCUMENTS

| 5,389,928 A | 2/1995 | Coppero et al. |
| 9,007,241 B2 | 4/2015 | Alhussien et al. |

(Continued)

FOREIGN PATENT DOCUMENTS

| CN | 102104444 A | 6/2011 |
| CN | 103281166 A | 9/2013 |

(Continued)

OTHER PUBLICATIONS

Saber et al., "An Incremental Redundancy Hybrid ARQ Scheme via Puncturing and Extending of Polar Codes", IEEE Transactions on Communications, 63(11): 3964-3973 (2015).

(Continued)

*Primary Examiner* — Faruk Hamza
*Assistant Examiner* — Abusayeed M Haque
(74) *Attorney, Agent, or Firm* — Leydig, Voit & Mayer, Ltd.

(57) ABSTRACT

Encoding devices and methods, arranged to execute encoding, wherein an input vector for polar encoding is computed, wherein the input vector comprises a set of information bits and a set of frozen bits, and an intermediate codeword is generated by executing a polar encoding of the input vector. Further, punctured and shortened bits are removed from the intermediate codeword, to obtain a reduced intermediate codeword, and an output codeword is generated by applying a permutation operation on the reduced intermediate codeword. A sequence of extension bits is selected from the intermediate codeword bits and information bits, and modulated symbols are generated by applying bitmapping on the output codeword and on the sequence of extension bits.

16 Claims, 17 Drawing Sheets

(51) Int. Cl.
*H04W 84/18* (2009.01)
*H04L 29/06* (2006.01)
*H04L 1/00* (2006.01)
*H03M 13/13* (2006.01)
*H03M 13/00* (2006.01)
*H03M 13/25* (2006.01)
*H04L 1/16* (2006.01)
*H04L 1/18* (2006.01)

(52) U.S. Cl.
CPC ... *H03M 13/6306* (2013.01); *H03M 13/6356* (2013.01); *H03M 13/6362* (2013.01); *H04L 1/1614* (2013.01); *H04L 1/1819* (2013.01)

(56) References Cited

U.S. PATENT DOCUMENTS

| | | | |
|---|---|---|---|
| 9,176,927 B2 | 11/2015 | Gross et al. | |
| 9,178,532 B2 | 11/2015 | Li et al. | |
| 9,209,832 B2 | 12/2015 | Alhussien et al. | |
| 2003/0043928 A1* | 3/2003 | Ling | H04L 25/03171 375/267 |
| 2014/0108748 A1 | 4/2014 | Lee et al. | |
| 2014/0169388 A1 | 6/2014 | Jeong et al. | |
| 2015/0077277 A1* | 3/2015 | Alhussien | H04L 1/0057 341/67 |
| 2015/0091742 A1* | 4/2015 | Ionita | H03M 13/251 341/57 |
| 2015/0092886 A1 | 4/2015 | Ionita et al. | |
| 2015/0236715 A1 | 8/2015 | Alhussien et al. | |
| 2015/0263767 A1 | 9/2015 | Shin et al. | |
| 2015/0295593 A1* | 10/2015 | Trifonov | H03M 13/13 714/776 |
| 2015/0333769 A1 | 11/2015 | Jeong et al. | |
| 2016/0013810 A1 | 1/2016 | Gross et al. | |
| 2016/0065257 A1* | 3/2016 | Fujii | H04B 7/0456 375/267 |
| 2016/0079999 A1 | 3/2016 | Shen et al. | |
| 2016/0269050 A1 | 9/2016 | Shen et al. | |
| 2016/0285479 A1* | 9/2016 | El-Khamy | H03M 13/616 |
| 2016/0308644 A1 | 10/2016 | Shen et al. | |
| 2017/0005753 A1 | 1/2017 | Shen et al. | |
| 2017/0012739 A1 | 1/2017 | Shen et al. | |
| 2017/0012740 A1 | 1/2017 | Shen et al. | |
| 2017/0019214 A1 | 1/2017 | Shen et al. | |
| 2017/0077954 A1 | 3/2017 | Shen et al. | |
| 2017/0085294 A1* | 3/2017 | Levacov | H04B 7/0413 |
| 2019/0215133 A1* | 7/2019 | Pan | H04L 1/0061 |

FOREIGN PATENT DOCUMENTS

| | | |
|---|---|---|
| CN | 103414540 A | 11/2013 |
| CN | 103778958 A | 5/2014 |
| CN | 104219019 A | 12/2014 |
| CN | 105430421 A | 3/2016 |
| CN | 105009461 B | 12/2017 |
| CN | 105164956 B | 5/2019 |
| CN | 105340183 B | 10/2019 |
| GB | 1403710 A | 8/1975 |
| JP | H0848473 A | 2/1996 |
| WO | 2015074192 A1 | 5/2015 |
| WO | 2015100561 A1 | 7/2015 |
| WO | 2015100572 A1 | 7/2015 |
| WO | 2015139248 A1 | 9/2015 |
| WO | 2015139297 A1 | 9/2015 |
| WO | 2015143593 A1 | 10/2015 |
| WO | 2015149225 A1 | 10/2015 |
| WO | 2015180187 A1 | 12/2015 |

OTHER PUBLICATIONS

Chen et al., "A Hybrid ARQ Scheme Based on Polar Codes", IEEE Communications Letters, 17(10):1996-1999 (2013).

Trifonov et al., "Polar Subcodes", IEEE Journal on Selected Areas in Communications, 34(2):254-266 (2016).

El-Khamy et al., "HARQ Rate-Compatible Polar Codes for Wireless Channels", 2015 IEEE Global Communications Conference (GLOBECOM), IEEE, pp. 1-6, Dec. 6, 2015.

Arikan, Erdel, "Channel Polarization: A Method for Constructing Capacity-Achieving Codes for Symmetric Binary-Input Memoryless Channels", IEEE Transactions on Information Theory, 55(7):3051-3073 (2009).

Trifonov, et al., "Polar Codes with Dynamic Frozen Symbols and Their Decoding by Directed Search", In Proceedings of IEEE Information Theory Workshop, pp. 1-5, Sep. 2013.

Miloslavskaya, et al., "Sequential Decoding of Polar Codes", IEEE Communications Letters, 18(7):1127-1130, (2014).

Miloslavskaya, Vera, "Shortened Polar Codes", IEEE Transactions on Information Theory, 61(9):4852-4865 (2015).

* cited by examiner

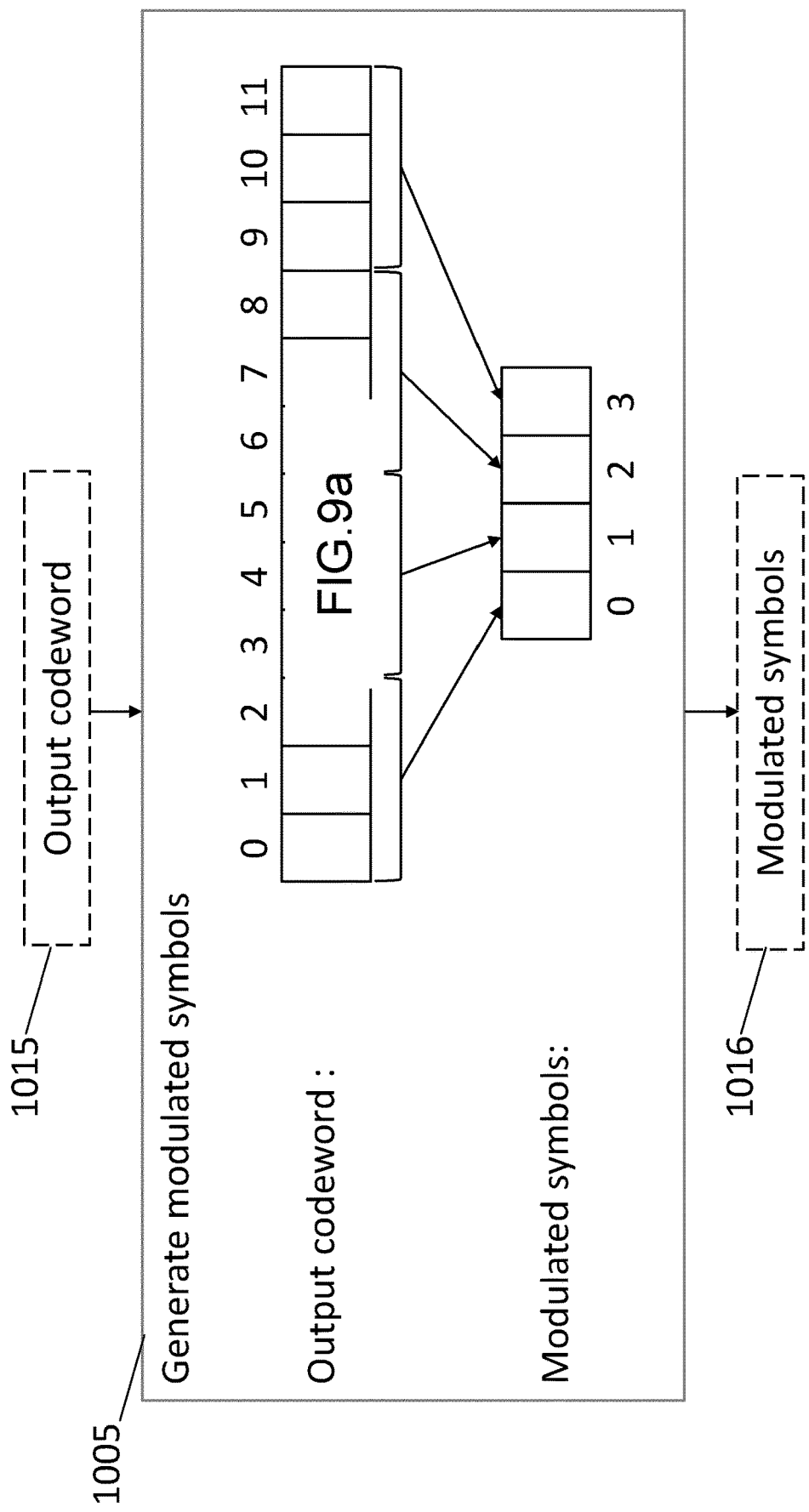

DEVICE AND METHOD FOR EXECUTING ENCODING

CROSS-REFERENCE TO RELATED APPLICATIONS

This application is a continuation of International Application No. PCT/RU2016/000488, filed on Jul. 27, 2016, the disclosure of which is hereby incorporated by reference in its entirety.

TECHNICAL FIELD

Embodiments of the present invention are directed to a device and to a method, wherein said device and said method are arranged to execute encoding. Additionally, embodiments are directed to a computer program product and to a computer-readable recording medium, wherein said computer program product and said computer-readable recording medium are arranged to execute encoding.

BACKGROUND

Modern communication systems must cope with varying channel conditions and different throughput constraints. Polar codes are error-correcting codes with an explicit construction, which are able to achieve a symmetric capacity of wide class of communication channels. They have three properties that are of interest to a variety of communication and data transmission systems. First, they have a low error-floor due to their large stopping distance, secondly, polar encoding has low complexity and can be implemented in an easy and efficient way, and thirdly, they are optimal for successive cancelation decoding, which represents an efficient decoding method.

However, the polar codes are inflexible with regard to their lengths. Generally, the polar codes provide codewords with a length that is an integer power of two.

The existing techniques for tweaking length of polar code can be classified into three broad categories. The first category is concatenated codes with inner or outer polar ones. Their correction capability can be better than in the case of original polar codes, however, they are inefficient with regard to decoding. The decoding complexity is too high, since decoding in component codes is needed. Second, non-Arikan 1×1 kernel can be used to obtain polar codes of length $l^m$. Similarly to concatenated codes, correction capability of codes with 1×1 kernel can be better than in the case of original polar codes and their decoding complexity is too high, since decoding in codes generated by last rows of the 1×1 kernel is needed. The third category consists of punctured polar codes and shortened polar codes with 2×2 kernel (original polar codes). Correction capability of punctured polar codes and shortened polar codes is slightly lower than in the case of original polar codes, and it depends on the selected puncturing pattern or shortening pattern, respectively, as well as the set of frozen bits. Decoding complexity in the case of successive cancellation decoding is almost the same as in the case of original polar codes.

Thus, there is still a need for efficient encoding techniques that, when based on polar encoding, result in codewords of variable lengths and that, at the same time, lead to efficient and accurate decoding.

SUMMARY

Embodiments of the present invention provide a method and device that are arranged to execute encoding by use of polar codes and that overcome at least the above mentioned drawbacks.

In particular, the embodiments as specified in the claims and as described herein in connection with the appended figures execute an encoding that is based on polar encoding. In this way, the embodiments benefit from the advantages of polar encoding. Some of the advantages are listed above. Additionally, the features of the present invention ensure that codewords with variable lengths may be generated in an efficient way such that different transmission conditions can be taken into account. Furthermore, the embodiments are directed to an efficient encoding process. The embodiments provide an encoding with a low complexity, thus enhancing the transmission of encoded information. Additionally, an error-correcting code, employed for encoding, is such that decoding techniques, developed for original polar codes, are applicable for its decoding, and probability of occurrence of errors during a decoding is minimized considerably. Error-correcting code, employed for encoding, is a punctured shortened polar code optimized for pre-selected modulation. For example, embodiments are applicable for bit-interleaved coded modulation. Moreover, the embodiments provide an encoding technique that is well prepared for occurrence of errors at the decoder side. According to the embodiments, additional extension bits for extending the output codeword are generated. The extension bits can be used in a hybrid automatic repeat request (HARD) scheme, if required. In this way, an effective securing of successful decoding process is enabled, while presence of extension bits has almost no effect on decoding complexity.

The above-mentioned object of the present invention is achieved by the solution provided in the enclosed independent claims. Advantageous implementations of the present invention are further defined in the respective dependent claims.

According to an embodiment, a device, arranged to execute encoding, is provided, wherein the device is configured to: compute an input vector for polar encoding, wherein the input vector comprises a set of information bits and a set of frozen bits; execute a polar encoding of the input vector to obtain an intermediate codeword; remove punctured and shortened bits from the intermediate codeword to obtain a reduced intermediate codeword; apply a permutation operation on the reduced intermediate codeword to obtain an output codeword; select a sequence of extension bits from the intermediate codeword and from the information bits; and generate modulated symbols by applying bitmapping on the output codeword and the sequence of extension bits. Values of frozen bits are computed according to freezing constraints, where a freezing constraint is a linear combination of information bits assigned to a particular frozen bit.

According to an embodiment, the device is configured to use a codeword pattern, wherein the codeword pattern indicates punctured bits, shortened bits and reliabilities of bits to be transmitted, and wherein the codeword pattern is optimized for successive cancellation decoding.

According to an embodiment, the device is configured to determine the codeword pattern by: determining a set of optimal inner patterns with regard to a pre-set code length and with regard to the number of information bits. Each pattern from the set of optimal inner patterns represents a sequence of bit type entries, wherein each bit type entry represents one of the following bit-types: output codeword bit type, shortened bit type, punctured bit type, where sub-types for output codeword bit type are provided for bits with different reliabilities; and provides a lower successive cancelation decoding error probability than inner patterns outside the set of optimal inner patterns. The device is configured further to determine the codeword pattern by selecting, as the codeword pattern, a pattern, which is based on an inner pattern from the set of optimal inner patterns and which minimizes decoding error probability.

According to an embodiment, the device is configured to determine freezing constraints together with a set of frozen bits, which minimizes a successive cancellation decoding error probability for given codeword pattern.

According to an embodiment, the device is configured to remove punctured and shortened bits from the intermediate codeword according to the codeword pattern.

According to an embodiment, the device is configured to determine a permutation pattern based on the codeword pattern, wherein the permutation pattern is optimized with regard to decoding error probability.

According to an embodiment, the device is configured to apply the permutation operation according to the permutation pattern.

According to an embodiment, the device is configured to select the sequence of extension bits by: selecting one information bit from the sequence of information bits and selecting one codeword bit from the intermediate codeword; determining a first successive cancelation decoding error probability for a code, extended by the selected information bit, and determining a second successive cancelation decoding error probability for the code, extended by the selected codeword bit, wherein the code is specified by freezing constraints, codeword pattern and the sequence of extension bits; if the first successive cancelation decoding error probability is smaller than or equal to the second successive cancelation decoding error probability, adding the selected information bit to the sequence of extension bits; and if the second successive cancelation decoding error probability is smaller than the first successive cancelation decoding error probability, adding the selected codeword bit to the sequence of extension bits.

According to an embodiment, the device is configured to: select, from the intermediate codeword, a codeword bit, which provides a balance of sums of codeword bit error probabilities; and/or select, from the set of information bits, an information bit that minimizes a successive cancellation decoding error probability for the intermediate codeword.

According to an embodiment, the device is configured to repeat the execution of the extension steps until the sequence of extension bits comprises a pre-set number or bits.

According to an embodiment, the device is configured to transmit to another device the modulated symbols, wherein all modulated symbols, obtained from the output codeword, are transmitted. As shown below, a situation may arise, in which more than one transmission is required because the decoding side is not able to decode the modulated symbols correctly, as shown in the following. All modulated symbols, obtained from the output codeword are transmitted particularly at the first time of transmission.

According to an embodiment, the device is configured to receive from the another device a feedback on the transmission of the modulated symbols, wherein the feedback indicates one of the following: a successful decoding of the modulated symbols, a failed decoding of the modulated symbols.

According to an embodiment, if the feedback indicates a failed decoding of received noisy modulated symbols, the device is configured to: generate further modulated symbols by applying bitmapping to further bits of sequence of extension bits, wherein the further bits are bits determined by executing the selecting of the extension bits; and transmit to the another device the further modulated symbols.

The present embodiments refer also to a method arranged to execute encoding, wherein the method comprises steps of: computing an input vector for polar encoding, wherein the input vector comprises a set of information bits and a set of frozen bits; executing polar encoding of the input vector to obtain an intermediate codeword; removing punctured and shortened bits from the intermediate codeword to obtain a reduced intermediate codeword; applying a permutation operation on the reduced intermediate codeword to obtain an output codeword; selecting a sequence of extension bits from the intermediate codeword and from the information bits; and generating modulated symbols by applying bit-mapping on the output codeword and the sequence of extension bits. Generally, the method is arranged to execute any of the steps executed by the device introduced above and explained in more detail below.

Further, the present embodiments refer to a computer program product comprising computer readable program code that is configured to cause a computing device to execute steps of the method introduced above and explained in more detail below.

Furthermore, the present embodiments relate to a computer-readable recording medium configured to store therein said computer program product.

BRIEF DESCRIPTION OF DRAWINGS

The above-described aspects and implementation forms of the present invention will be explained in the following description of specific embodiments in relation to the enclosed drawings, in which

FIG. 8 shows results of which code design steps of FIG. 3 and results of which code extending steps of FIG. 5 specify which encoding steps of FIG. 2.

FIGS. 8A, 8B, 8C and 8D illustrate an example for an execution of steps of FIG. 2 according to an embodiment of the present invention.

DETAILED DESCRIPTION OF EMBODIMENTS

Generally, it has to be noted that all arrangements, devices, modules, components, models, elements, units, entities, and means and so forth described in the present application could be implemented by software or hardware elements or any kind of combination thereof. All steps which are performed by the various entities described in the present application as well as the functionality described to be performed by the various entities are intended to mean that the respective entity is adapted to or configured to perform the respective steps and functionalities. Even if in the following description of the specific embodiments, a specific functionality or step to be performed by a general entity is not reflected in the description of a specific detailed element of the entity which performs the specific step or functionality, it should be clear for a skilled person that these methods and functionalities can be implemented in respective hardware or software elements, or any kind of combination thereof. Further, the method of the present invention and its various steps are embodied in the functionalities of the various described apparatus elements. Moreover, any of the embodiments and features of any of the embodiments, described herein, may be combined with each other, unless a combination is explicitly excluded.

Figure 1:
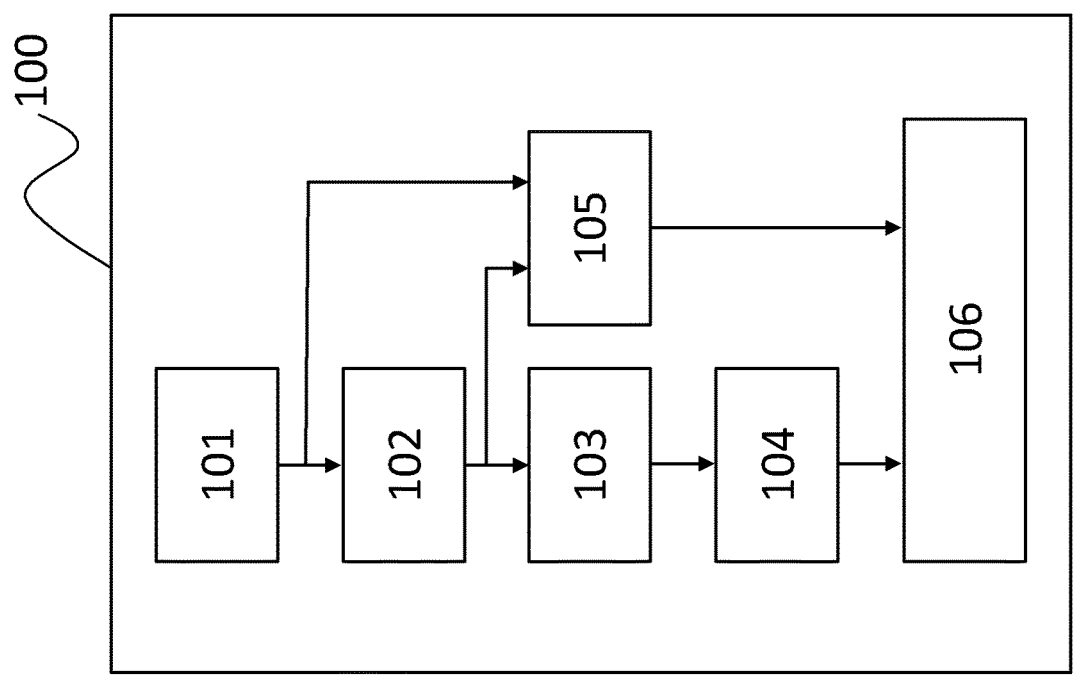
FIG. 1 shows a schematic overview of a device arranged to execute encoding according to an embodiment of the present invention.
Figure 2:
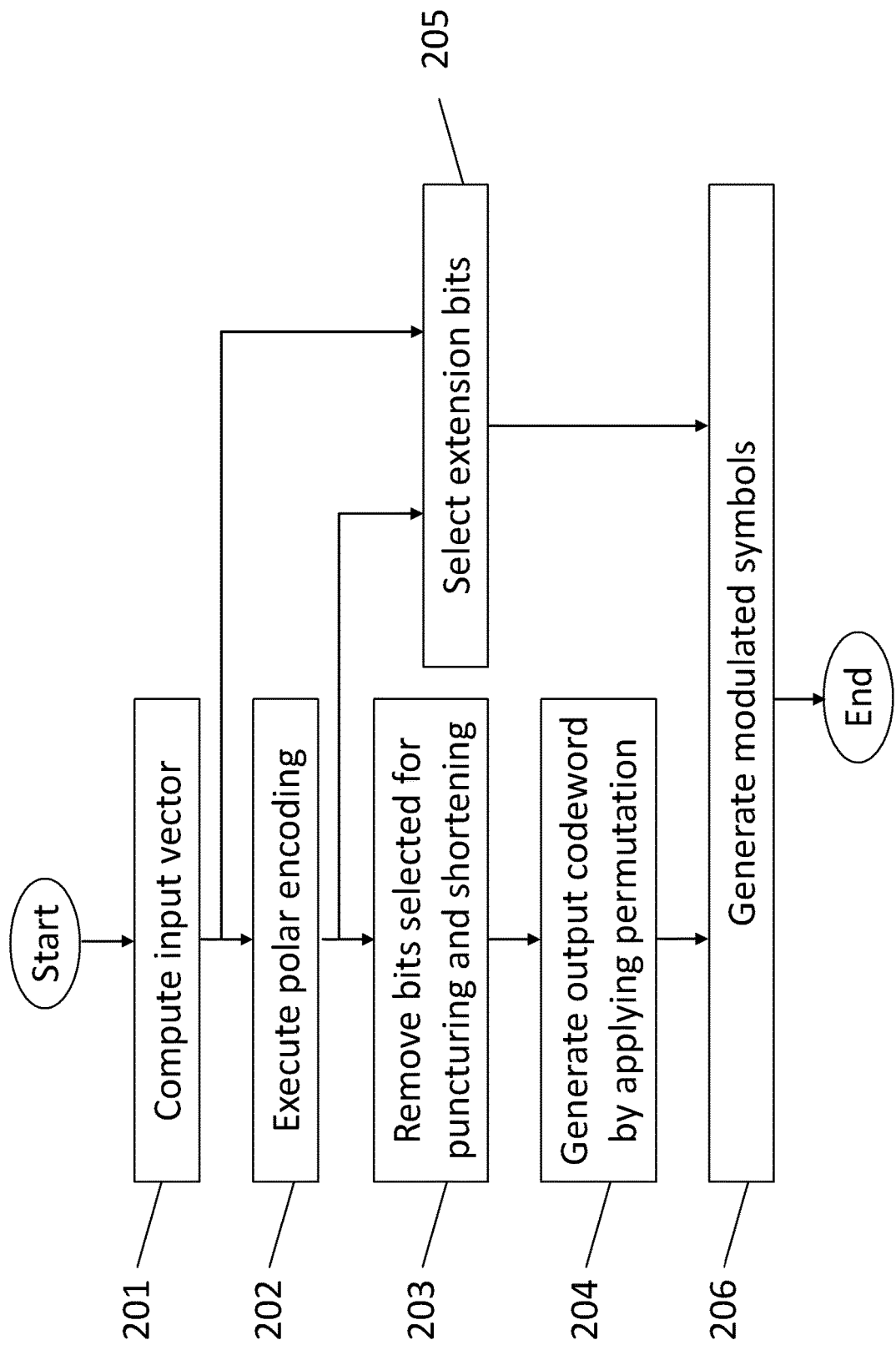
FIG. 2 shows a flow-diagram of a method arranged to execute encoding according to an embodiment of the present invention.

FIG. 1 shows a schematic overview of a device 100 arranged to execute encoding according to an embodiment of the present invention. The device 100 can be referred to also as encoding device or encoder. FIG. 2 shows a flow-diagram of a method arranged to execute encoding according to an embodiment of the present invention. In particular, the method comprises steps executed by the device 100. Therefore, in the following the device 100 of FIG. 1 and the steps of FIG. 2 will be considered together.

According to the present embodiment, the device 100 comprises an input vector computing entity 101. The device 100 and, according to the present embodiment, the input vector computing entity 101 is configured to compute 201 an input vector for polar encoding, wherein the input vector comprises a set of information bits and a set of frozen bits.

The polar encoding is generally well known. Originally polar codes were proposed in E. Arkan: "Channel Polarization: A Method for Constructing Capacity-Achieving Codes for Symmetric Binary-Input Memoryless Channels", IEEE Transactions on Information Theory, Vol. 55, No. 7, pages 3051-3073, July 2009. As to the polar codes, polar encoding, and the terms used with regard to polar codes and polar encoding, the present disclosure refers to the publication of Arkan.

Original binary polar codes are specified by a triple (N, K, I), where $N=2^m$ is the length of the output codeword, K is the code dimension, which is the number of information bits to be encoded, and I with |I|=K is the set of indices known as information bit indices. The remaining N−K indices are referred to as frozen bit indices. A polar code codeword can be obtained by multiplication of an input vector by matrix $$\begin{pmatrix} 1 & 0 \\ 1 & 1 \end{pmatrix}^{\otimes m},$$

where the input vector is a binary vector of length N with information bits on positions given by I, and ⊗ m denotes m-times Kronecker product of a matrix with itself. The K information bit indices of the set I comprise the most reliable bits and are used to send information bits. Therefore, the terms "information bit index" and "information bit" are often used for representing the same, namely a bit for sending information. Similarly, the terms "frozen bit index" and "frozen bit" are used to represent the same, namely a bit that does not represent an information bit.

The device 100, in particular, the input vector computing entity 101 determines or constructs 201 input vector data comprising a set of information bits I and a set of frozen bits, i.e. remaining N−K bits. According to an embodiment, the set of information bits is received as input by the device 100, in particular, by the input vector computing entity 101 and/or as an input for the step 201.

According to the present embodiment, the device 100 comprises further an intermediate codeword generating entity 102. According to the present embodiment, the intermediate codeword generating entity 102 receives or retrieves the input vector generated or computed 201 by the input vector computing entity 101 and comprising the set of information bits and the set of frozen bits. Further, the device 100 and, according to the present embodiment, the intermediate codeword generating entity 102 generates 202 an intermediate codeword by executing polar encoding of the input vector, i.e. by executing polar encoding based on the information bits and the frozen bits of the input vector.

The polar encoding can be executed 202 as generally known. According to an embodiment, the polar encoding is executed 202 as disclosed in the above-mentioned publication of Arkan, i.e. by multiplication of input vector by matrix $$\begin{pmatrix} 1 & 0 \\ 1 & 1 \end{pmatrix}^{\otimes m}.$$

According to another embodiments, another known implementation variants are possible.

Further, according to the present embodiment, the device 100 comprises a punctured and shortened bit removing entity 103. According to the present embodiment, the device 100 or the punctured and shortened bit removing entity 103 respectively receives or retrieves the intermediate codeword generated 202 by the intermediate codeword generating entity 102. The device 100 and, according to the present embodiment, the punctured and shortened bit removing entity 103 removes 203 from the intermediate codeword such bits that have been selected or determined for puncturing and shortening. According to an embodiment, the bits that have been selected or determined for puncturing and shortening are indicated in a codeword pattern. According to a further embodiment, the device 100 or the punctured and shortened bit removing entity 103 respectively remove 203 said bits according to a codeword pattern. The codeword pattern is a pattern that has been determined with regard to particular settings such as code length n and dimension k, which is the number of information bits.

According to the present embodiment, the device 100 comprises a permutation entity 104. According to the present embodiment, the device 100 or the permutation entity 104 respectively receives or retrieves the intermediate codeword without punctured and shortened bits, i.e. the reduced intermediate codeword, which is the intermediate codeword resulting from the removal 203 of bits that have been selected or determined for puncturing and shortening. The device 100 and, according to the present embodiment, the permutation entity 104 generates 204 an output codeword by applying a permutation operation on the reduced intermediate codeword. According to an embodiment, the generation 204 of the output codeword is executed according to a permutation pattern. As shown in the following, the codeword pattern is associated with the permutation pattern. Here, the expression "associated with" means that the codeword pattern represents a basis for the permutation pattern, as will be shown in the following.

Further, according to the present embodiment, the device 100 comprises an extension bit selecting entity 105. According to the present embodiment, the device 100 or the extension bit selecting entity 105 respectively receives or retrieves the input vector (in particular, the information bits of the input vector) and the intermediate codeword as generated 202 by the execution of the polar encoding. The device 100 and, according to the present embodiment, the extension bit selecting entity 105 selects 205 a set of extension bits from the intermediate codeword and from the set of information bits.

According to the present embodiment, the device 100 comprises a modulated symbol generating entity 106. According to the present embodiment, the modulated symbol generating entity 106 receives or retrieves the output codeword (as generated 204 by applying the permutation operation on the reduced intermediate codeword, i.e., the intermediate codeword without punctured and shortened bits) and the selected sequence of extension bits. The device 100 and, according to the present embodiment, the modulated symbol generating entity 106 generates 206 then modulated symbols by applying bitmapping on the output codeword and the sequence of extension bits. The output codeword, as well as the sequence of extension bits, represent a sequence of bits. By the execution of the bitmapping 206, the one or more bits of the sequence of bits are mapped to symbols that are determined for the transmission/provision of the encoded information to a receiver, which comprises an appropriate decoder.

Figure 3:
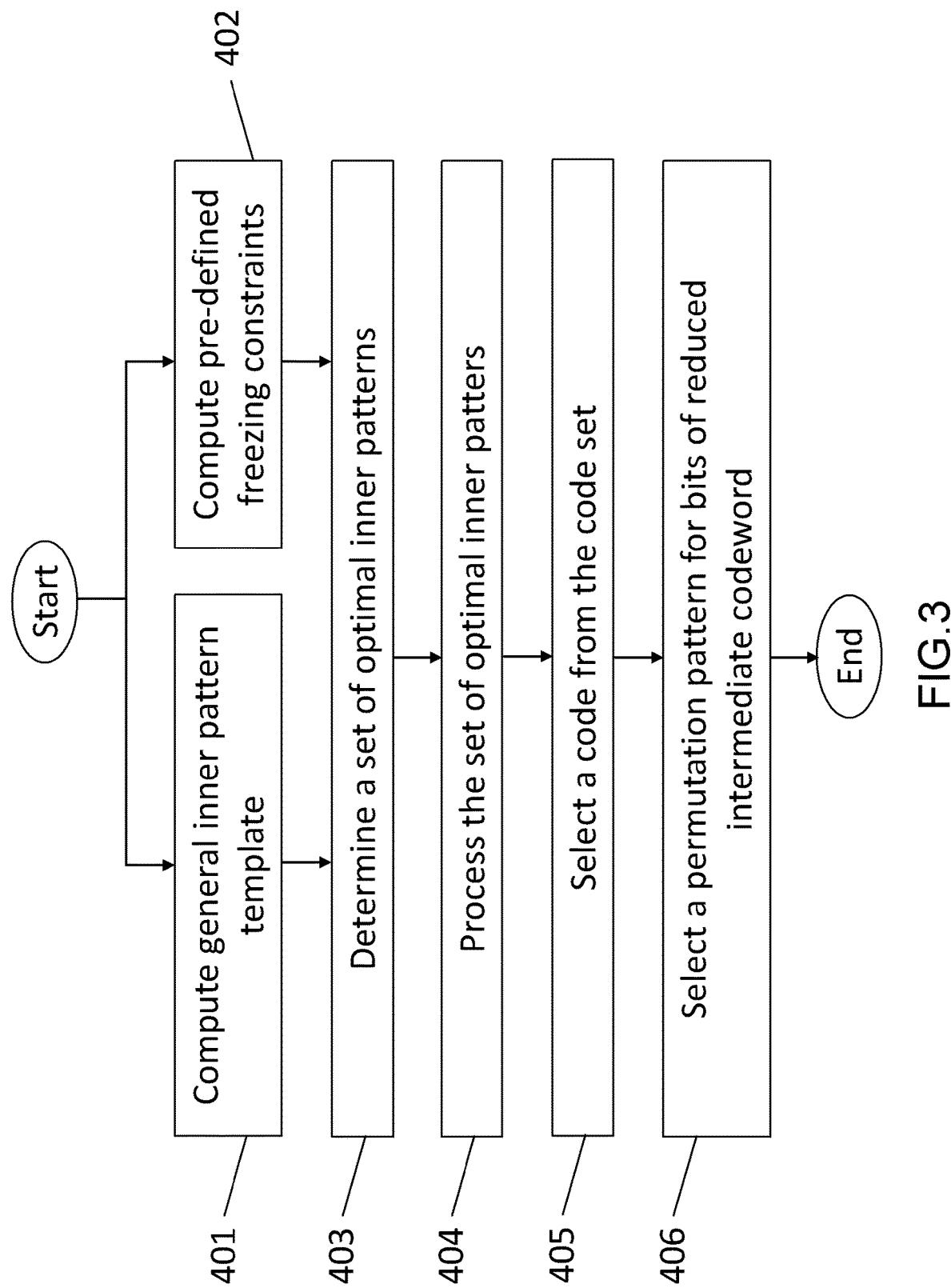
FIG. 3 shows a flow-diagram of a code design steps executed for determining freezing constraints, a codeword pattern, and a permutation pattern according to an embodiment of the present invention.

FIG. 3 shows a flow-diagram of steps executed for determining freezing constraints, a codeword pattern and a permutation pattern according to the embodiment of the present invention. The entities of the device 100 introduced below are provided exemplary. According to further embodiments, at least some of the entities are composed to one processing entity, for example. In general, the device 100 is configured to execute the steps of said entities.

According to the present embodiment, the device 100 comprises a general inner pattern template computation entity. The device 100 and, in particular, the general inner pattern template computation entity is configured to compute or generate 401 inner pattern parameters: the number of punctured and shortened bits within inner pattern, as well as the number bits of each of T output codeword bit types within inner pattern. A general inner pattern template is a template which specifies all inner patterns with desired parameters.

Generally, a polar code of length $2^m$ can be represented as a generalized concatenated code with nested inner codes of length $2^\mu$ and outer codes of length $2^{m-\mu}$, where $\mu \le m$, inner and outer codes are also polar ones. Thus, codeword of the polar code can be treated as concatenation of $2^{m-\mu}$ codewords of its highest-rate inner code. Decoding of a polar code can be represented via decoding in its inner and outer codes.

The inner pattern template is a representation for a number of inner patterns and represents a kind of placeholder for inner patterns with particular similarity. General inner pattern template is an inner pattern template which represents all inner patterns with desired parameters, i.e. any inner pattern represented by any inner pattern template is also represented by a general inner pattern template. According to an embodiment, in step 401, general inner pattern template is determined 401. Particularly, the number of punctured and shortened bits within inner pattern is determined or computed in step 401 in view of polar code length $N=2^m$, the desired code length n and modulation parameters. According to an embodiment, the length of the inner pattern or inner pattern template represents a range of possible lengths of inner codes of a polar code. In particular, said length of inner pattern is represented by $2^\mu$, where $1 \le 2^\mu \le N = 2^m$, $2^{m-1} < n \le N$.

Further, according to the present embodiment, the device 100 comprises a pre-defined freezing constraints computing entity, where a freezing constraint is a linear combination of information bits, which is assigned to a frozen bit. The device 100 and, in particular, the pre-defined freezing constraints computing entity is configured to determine or compute 402 freezing constraints which are sufficient to specify a code of length $N=2^m$ and with desired minimum distance d. Let $K \ge k$ be the number of information bits of this code, so the number of pre-defined freezing constraints is equal to (N−K). In particular, an extended BCH code can be employed to derive such pre-defined freezing constraints. If minimum distance d=1, then no pre-defined freezing constraints is required and K=N. So, in step 402, particularly, the number of pre-defined frozen bits within input vector in view of the polar code length N and desired minimum distance of non-punctured code is determined, said number of pre-defined freezing constraints being N−K.

According to the present embodiment, the device 100 comprises an inner pattern determining entity. The device 100 and, in particular, the inner pattern determining entity is configured to determine or construct 403 a set S of optimal inner patterns $S_\mu$. The set S comprises a required number of non-equivalent inner patterns $S_\mu$, such that successive cancellation decoding error probabilities for polar codes based on $2^{m-\mu}$-times repetitions of these inner patterns $S_\mu$ are lower than in the case any other inner pattern $S_\mu$ which is not equivalent to patterns from the set S. Here two inner patterns are referred as equivalent if successive cancellation decoding error probabilities computed for bits of input vector are the same for these patterns. The set S of optimal inner patterns $S_\mu$ is determined with regard to the pre-set intermediate codeword length $N=2^m$, the pre-defined (N−K) freezing constraints, the number of punctured and shortened bits, as well as with regard to the number T of bits specifying a modulated symbol and reliabilities of these bits. For this purpose, the above-mentioned general inner pattern template and the above-mentioned (N−K) freezing constraints are considered or taken into account. The inner patterns $S_\mu$, determined in step 403, are such that their lengths are $2^\mu$.

Each of the inner patterns $S_\mu$ represents a sequence of bit type entries, wherein each bit type entry represents one of the following bit-types: output codeword bit type, shortened bit type, punctured bit type. There are T types of output codeword bits, where T is the number of bits required to specify a modulated symbol. Bit types specify reliabilities of bits. Reliability of a bit can be characterized by error probability, in particular, shortened bits associated with zero error probability, while punctured bits are associated with error probability 0.5. A shortened bit type entry is a kind of a placeholder for a bit to be shortened, and a punctured bit type entry is a kind of a placeholder for a bit to be punctured. As generally known, values of shortened codeword bits are equal to zero, and bits to be punctured are bits that are discarded.

Furthermore, in step 403, optimal inner patterns $S_\mu$ are determined by the device 100 and, in particular, the inner pattern determining entity. This means that the inner patterns $S_\mu$ are optimized with regard to the successive cancelation decoding error probability. For this purpose, according to an embodiment, the set of all inner patterns with desired parameters, i.e. inner patterns which can be obtained from general inner pattern template, is recursively partitioned into subsets, where each subset is specified by corresponding inner pattern template. For each subset of inner patterns that is considered during the step 403, a lower bound on the successive cancelation decoding error probability is determined. The determination of the successive cancelation decoding error probability is generally known, and any of the known methods may be applied here. A lower bound on the successive cancelation decoding error probability can be recursively computed via such lower bounds for polar codes of smaller length using expressions for successive decoding error probability computation. Generally, the successive cancelation decoding error probability expresses the probability that the result of successive cancellation decoding will not correspond to transmitted codeword. This lower bound on error probability is determined with regard to each subset of inner patterns considered in step 403, where each such subset is represented by an inner pattern template. An inner pattern $S_\mu$ is determined 403 as being optimal if it has one of the smallest successive cancelation decoding error probabilities.

According to an embodiment, the determining of the set of optimal inner patterns $S_\mu$ is executed by performing a search over a tree. According to an embodiment, each node of the tree is represented by an inner pattern template and corresponding lower bound on the successive cancelation decoding error probability, where lower bound is such that it holds for any inner pattern which can be obtained from given inner pattern template. If inner pattern template of a node specifies a set A of inner patterns, then inner pattern templates of its child nodes specify disjoint subsets of the set A. Thus, lower bound computed for a node is not lower than lower bounds computed for its child nodes. Each leaf of the tree is represented by a pattern from which only a single inner pattern can be obtained and corresponding lower bound coincide with successive cancellation decoding error probability computed for this pattern. The search over tree begins from the root node represented by the general inner pattern template, i.e. inner pattern template from which any inner pattern with desired parameters can be obtained. The search over the tree is executed such that a next node that is visited in the tree for determining an optimal inner pattern $S_\mu$ is a node with the smallest lower bound on successive cancelation decoding error probability among non-visited nodes being child nodes of visited nodes. The search over the tree is completed when desired number of leaves is reached, which means that desired number of optimal inner patterns $S_\mu$ is selected. Before the search lower bounds on successive cancelation decoding error probability are unknown for all nodes. During the search it is sufficient to compute lower bounds on successive cancelation decoding error probability only for all child nodes of each node being visited.

Thus, in step 403, a set of optimal inner patterns is determined, wherein the inner patterns of the set of optimal inner patterns are optimized with regard to the successive cancelation decoding error probability. Generally, the inner patterns of the set of optimal inner patterns provide a lower successive cancelation decoding error probability than inner patterns outside the set. As mentioned above, step 403 is executed by the device 100 and, in particular, the inner pattern determining entity. According to an embodiment, for each inner pattern of the set of optimal inner patterns also the respective successive cancelation decoding error probability is stored. According to a further embodiment, the respective successive cancelation decoding error probability is stored in said set together with the respective optimal inner pattern.

According to the present embodiment, the device 100 comprises an inner pattern processing entity. The device 100 and, in particular, the inner pattern processing entity is configured to process 404, inner patterns $S_\mu$ of the set of optimal inner patterns S determined in step 403. The processing 404 is executed for generating a code set based on the inner patterns $S_\mu$ of the set of optimal inner patterns S. The generated code set comprises possible codes having the length n, wherein $2^{m-1} < n \leq 2^m = N$, and are generated for encoding information of length k.

Figure 4:
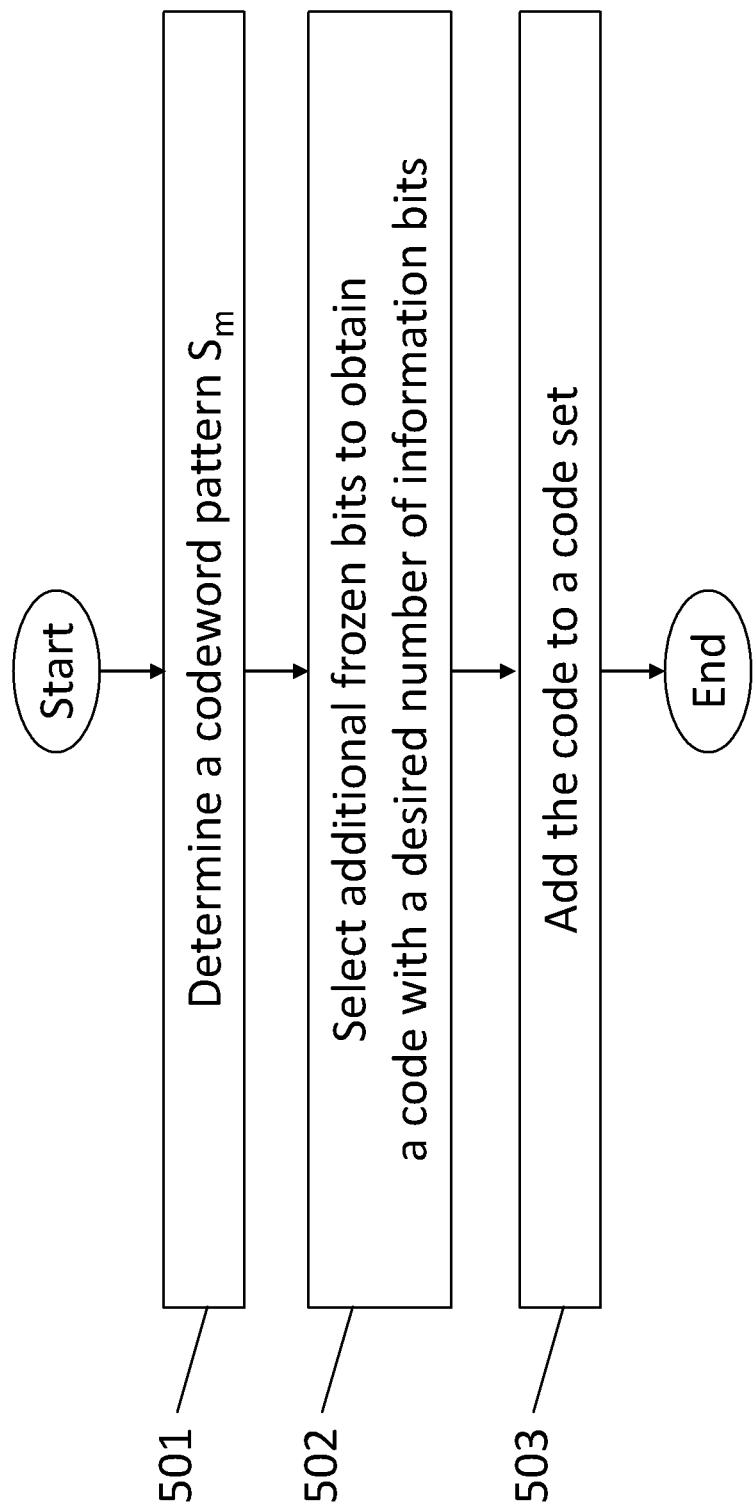
FIG. 4 shows a flow-diagram of further steps executed for processing the set of optimal inner patterns according to an embodiment of the present invention.

According to an embodiment, the inner pattern processing 404 comprises the following three steps executed with regard to each of the optimal inner patterns $S_\mu$ of the set S of optimal inner patterns, wherein the three steps are visualized in FIG. 4:

In a first step 501, for the respective optimal inner pattern $S_\mu$, a codeword pattern $S_m$ is constructed based on the respective optimal inner pattern $S_\mu$. In this step 501, according to an embodiment, at first the codeword pattern $S_m$ is initialized by $2^{m-\mu}$-times repetition of the inner pattern $S_\mu$, then the codeword pattern $S_m$ is refined to provide required number of each bit type entries. The refinement of the codeword pattern $S_m$ is performed by modification of a necessary number of bit type entries. Optimality criterion for this modification is balance of sums of codeword bit error probabilities, which means that a codeword is recursively divided into halves and within each division approximately the same sums of codeword bit error probabilities for obtained halves are provided. Thus, the refinement of the codeword pattern $S_m$ is required only if the desired number of punctured or shortened bits is not divisible by $2^{m-\mu}$ or if the required code length n is not divisible by $2^{m-\mu}T$, where T is the number of bits required to specify a modulated symbol. So, if m is equal to $\mu$, then the codeword pattern $S_m$ is equal the inner pattern $S_\mu$. According to an embodiment, the codeword pattern $S_m$ is stored. According to an embodiment the generated or constructed codeword pattern $S_m$ is associated with the respective optimal inner pattern $S_\mu$ such that the relationship between the respective codeword pattern $S_m$ and the respective optimal inner pattern $S_\mu$ can be found. Thus, it can be identified which codeword pattern $S_m$ is based on which optimal inner pattern $S_\mu$ and which optimal inner pattern $S_\mu$ constitutes which codeword pattern $S_m$.

In a second step 502, for the respective optimal inner pattern $S_\mu$, a code C for the corresponding codeword pattern $S_m$ is completed with regard to the desired number of information bits k to be encoded. For this purpose, additional frozen bits within the input vector are selected such that the total number of frozen bits is equal to (N−k) and successive cancellation decoding error probability of the obtained code C is as low as possible. Thus, the set of frozen bits for the code C includes frozen bits specified by predefined freezing constraints, frozen bits induced by shortening and the additional frozen bits. Value of each frozen bit is specified by corresponding freezing constraint, which is a linear combination of information bits. All additional frozen bits are equal to zero, thus freezing constraints for them are trivial. Generally, values of these (N−k) frozen bits are specified by (N−k) freezing constraints.

In a third step 503, the code C, generated for the respective optimal inner pattern $S_\mu$, is added to a code set. According to an embodiment, an association between the generated code C and the respective optimal inner pattern $S_\mu$ is generated such that the relationship between the respective code C and the respective optimal inner pattern $S_\mu$ can be found. Thus, it can be identified which code C is based on which optimal inner pattern $S_\mu$ and which optimal inner pattern $S_\mu$ constitutes which code C. Similarly, according to an embodiment, an association between the generated code C and the respective codeword pattern $S_m$ is generated such that the relationship between the respective code C and the respective codeword pattern $S_m$ can be found. Thus, it can be identified which code C is based on which codeword pattern $S_m$ and which codeword pattern $S_m$ constitutes which code C.

According to the present embodiment, the device 100 comprises further a code selection entity. As discussed above, with regard to each optimal inner pattern $S_\mu$, a code C with desired length n and number of information bits k is constituted or generated in step 502 and, subsequently, added to a code set in step 503. The device 100 and, particularly the code selection entity, is configured to select 405 a code from the code set. The selection 405 of the code is executed such that decoding error probability is minimized. For this purpose, the codes of the code set are explored with regard to their decoding error probabilities. According to an embodiment, the probability for each code of the code set is estimated analytically or by simulations. For example, in the case of successive cancellation decoding algorithm error probability can be estimated analytically, however, in the case of list/stack successive cancellation decoding simulations are required. Finally, a code from the code set is selected that has the smallest decoding error probability. Codes in the code set have the same length n, the number of information bits k, (N−K) pre-defined freezing constraints, the number of punctured bits and the number of shortened bits, where $2^{m-1}<n\leq 2^m$, $N=2^m$, and K is not less than k. Each of the codes C is specified by corresponding codeword pattern $S_m$ and by (N−k) freezing constraints, where codeword pattern $S_m$ represents a sequence of the bit type entries and indicates, thus bits to be punctured, bits to be shortened, and bits of the output codeword.

Moreover, there are T bit types of output codeword bits, since each modulated symbol is specified by a vector v consisting of T bits of output codeword. Reliability of a transmitted bit depends on position of this bit within corresponding vector v. Thus there are T bit types of output codeword bits corresponding to T positions within vector v.

Further, according to the present embodiment, the device 100 comprises a permutation pattern selection entity. The device and, particularly the permutation entity is configured to select 406 a permutation pattern representing a permutation for the bits of punctured shortened intermediate codeword, i.e. reduced intermediate codeword, (intermediate codeword without punctured and shortened bits). Application of the permutation to punctured shortened intermediate codeword results in output codeword. The selected permutation is required to minimize the effect of the dependent bits. Particularly, during the transmission of an output codeword, channel noise offend modulated symbols. Thus, high level of noise in one received modulated symbol results in T noisy bits of intermediate codeword in the decoder, i.e. if bits associated with the same modulated symbol then errors in them are correlated. So, decoding error probability depends on selected permutation. The proposed permutation is designed for successive cancellation decoding algorithm and its list/stack variations. The permutation is optimized to maximize the number of decoding calculations being performed for independent bits. For that intermediate codeword is subsequently partitioned into T vectors, where $2^{j-1}<T\leq 2^j$. Selected permutation pattern is such that (iT+t)-th bit of output codeword has bit type t and bits of output codeword on positions iT, iT+1, ... ,iT+T−1 belong to T different parts of the intermediate codeword, $0\leq t<T$. Thus, each modulation symbol is specified by bits belonging to different parts of intermediate codeword. Thus, in step 406, a corresponding permutation pattern for executing permutation on bits of a punctured shortened intermediate codeword is generated based on the selected codeword pattern. The permutation pattern comprises arrangement of bits of punctured shortened intermediate codeword, application of which results in output codeword.

Figure 5:
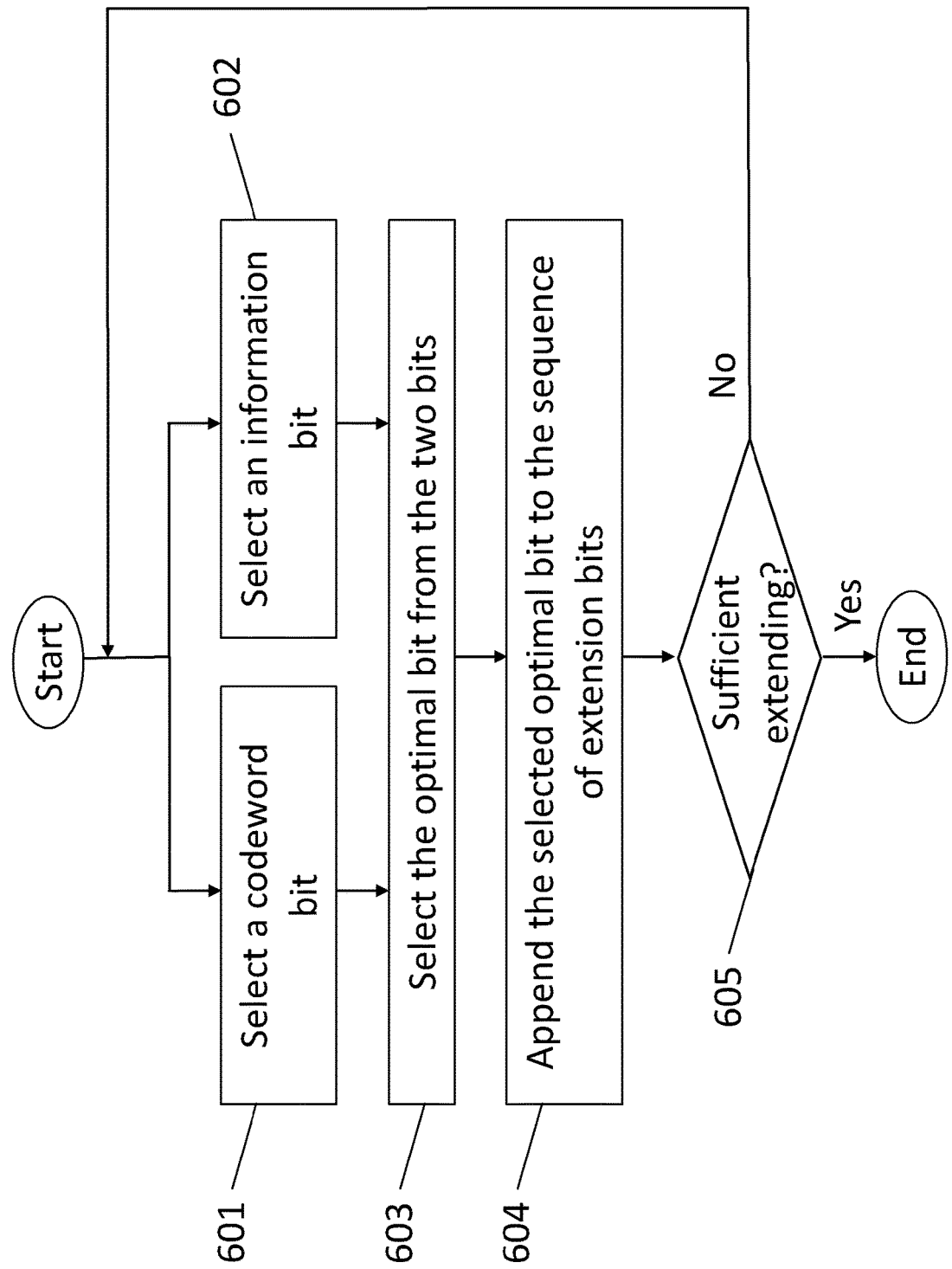
FIG. 5 shows a flow-diagram of a code extending steps executed for selecting extension bits according to an embodiment of the present invention.

FIG. 5 shows a flow-diagram of steps executed for selecting 205 extension bits according to an embodiment of the present invention. In particular, FIG. 5 shows an embodiment of sub-steps of the above mentioned selecting 205 of the extension bits. As mentioned, the selecting 205 of the extension bits is executed by the device 100 and, particularly, by the extension bit selection entity 105. Thus also the sub-steps of the embodiment of FIG. 5 are executed by the device 100 and, particularly, by the extension bit selection entity 105.

As mentioned, in step 205, a set of extension bits is selected from the intermediate codeword and the set of information bits. The selection 205 of extension bits is executed iteratively. According to the present embodiment, in each iteration, an extension by one bit is executed, i.e. one bit is added to the set of extension bits.

In step 601, a codeword bit is selected from the intermediate codeword according to balance of sums of codeword bit error probabilities criterion. The selected codeword bit can be either output codeword bit or a bit being punctured. In step 602, an information bit is selected from the set of information bits, where successive cancellation decoding error probability is employed as optimality criterion.

In step 603, the optimal bit from the two bits, selected in steps 601 and 602, is selected. For this purpose, a successive cancelation decoding error probability for an extended code, i.e. a code that has been extended by one of the selected bits is determined. A code being extended is specified by the (N−k) freezing constraints (being a result of step 405), a codeword pattern $S_m$ (being a result of step 405) and a sequence of already selected extension bits, where $N=2^m$. Ratio of the number of information bits in the sequence of already selected extension bits to the total number of bits in this sequence is also taken into account and this ratio will be further referred as extension ratio. More precisely, extension ratio is kept under a pre-set threshold. On the one side, a successive cancelation decoding error probability $P_e^{(inf)}$ for the code, extended by the selected 602 information bit, is determined. On the other side, a successive cancelation decoding error probability $P_e^{(cw)}$ for the code, extended by the selected 601 codeword bit, is determined. Subsequently, probabilities $P_e^{(inf)}$ and $P_e^{(cw)}$ are compared. If the successive cancelation decoding error probability $P_e^{(inf)}$ of the code, extended by the selected 602 information bit, is smaller than or equal to the successive cancelation decoding error probability $P_e^{(cw)}$ of the code, extended by the selected 601 codeword bit, and if extension ratio is lower than the pre-set threshold, the selected 602 information bit is considered as representing the optimal bit and is selected. If the successive cancelation decoding error probability $P_e^{(cw)}$ of the code, extended by the selected 601 codeword bit, is smaller than the successive cancelation decoding error probability $P_e^{(inf)}$ of the code, or if extension ratio is higher than the pre-set threshold, extended by the selected 602 information bit, the selected 601 codeword bit is considered as representing the optimal bit and is selected. In step 604, the selected optimal bit is appended to the sequence of extension bits.

Further, if $\min(P_e^{(cw)}, P_e^{(inf)}) < P_e^{(min)}$, the standard deviation a of the noise, for which initial code was optimized, is increased, wherein $P_e^{(min)}$ is a pre-set lower bound on the successive cancelation decoding error probability. Such adjustment is required since in the case of hybrid automatic repeat request scheme the number of transmitted extension bits depends on level of the noise in the channel. Thus, the higher level of the noise, the more extension bits is needed to provide reliable communication. This corresponds to increasing standard deviation a of the noise along with increasing length of sequence of extension bits.

In step 605, it is verified whether sufficient extending has been executed. For this purpose, a maximal number of extending bits or maximal size of the set of extension bits is pre-set or pre-determined. Thus, if the set of extension bits has reached the maximal size or if the number of bits in the set of extension bits is equal the maximal number, sufficient extending has been executed, and the iteration and the execution is terminated. Otherwise a next iteration step is started, and the execution proceeds with steps 601 and 602. Sequence of extension bits, obtained by iterative execution of step 605, is employed in step 205.

As can be gathered from the aforesaid, the selection of extension bits is performed bit by bit, wherein essentially three criteria of optimality are employed: successive cancelation decoding error probability, balance of sums of codeword bit error probabilities and the extension ratio. In the case of original polar code and binary phase-shift keying (BPSK) modulation selection of codeword bits according to balance of sums of codeword bit error probabilities criterion reduces to the selection of codeword bits according to bit reversal permutation. Here, balance of sums of codeword bit error probabilities criterion is such that according to it the most preferable codeword bit $c_i$ satisfies the following condition for any $a=t2^z$ and $b=(t+1)2^z$, where t and z are integers and $b \le 2^m$:

$$\text{if } (a \le i \le b) \text{ and } \sum_{j=0}^{\frac{a+b}{2}} P(j) > \sum_{j=\frac{a+b}{2}}^{b-1} P(j), \text{ then } \left(a \le i < \frac{a+b}{2}\right),$$

$$\text{otherwise: } \left(\frac{a+b}{2} \le i < b\right),$$

where P(j) is error probability for j-th codeword bit.

Figure 6:
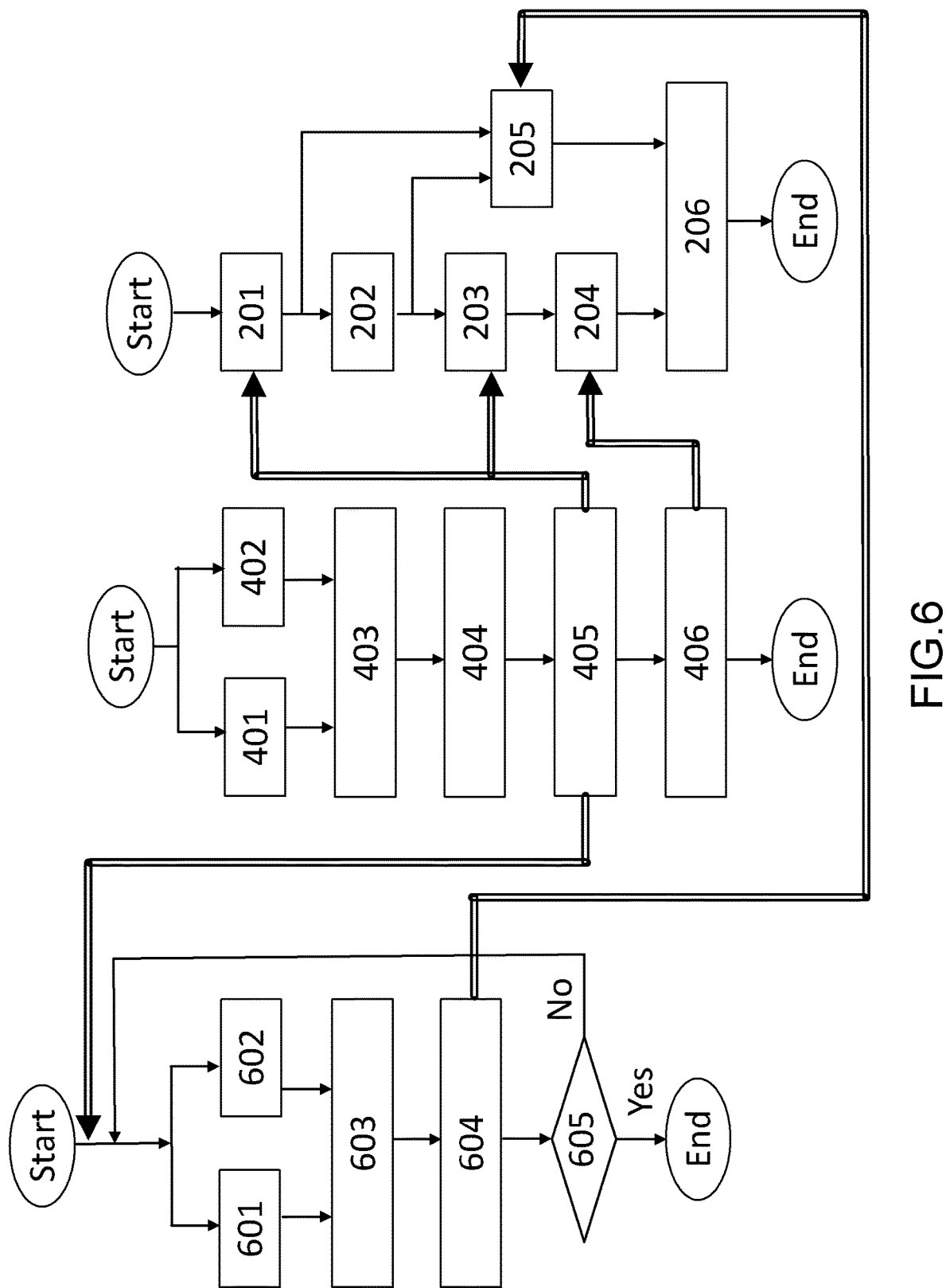
FIG. 6 shows relationships between the steps of FIGS. 2, 3, and 5 according to an embodiment of the present invention. More precisely.
Figure 7A:
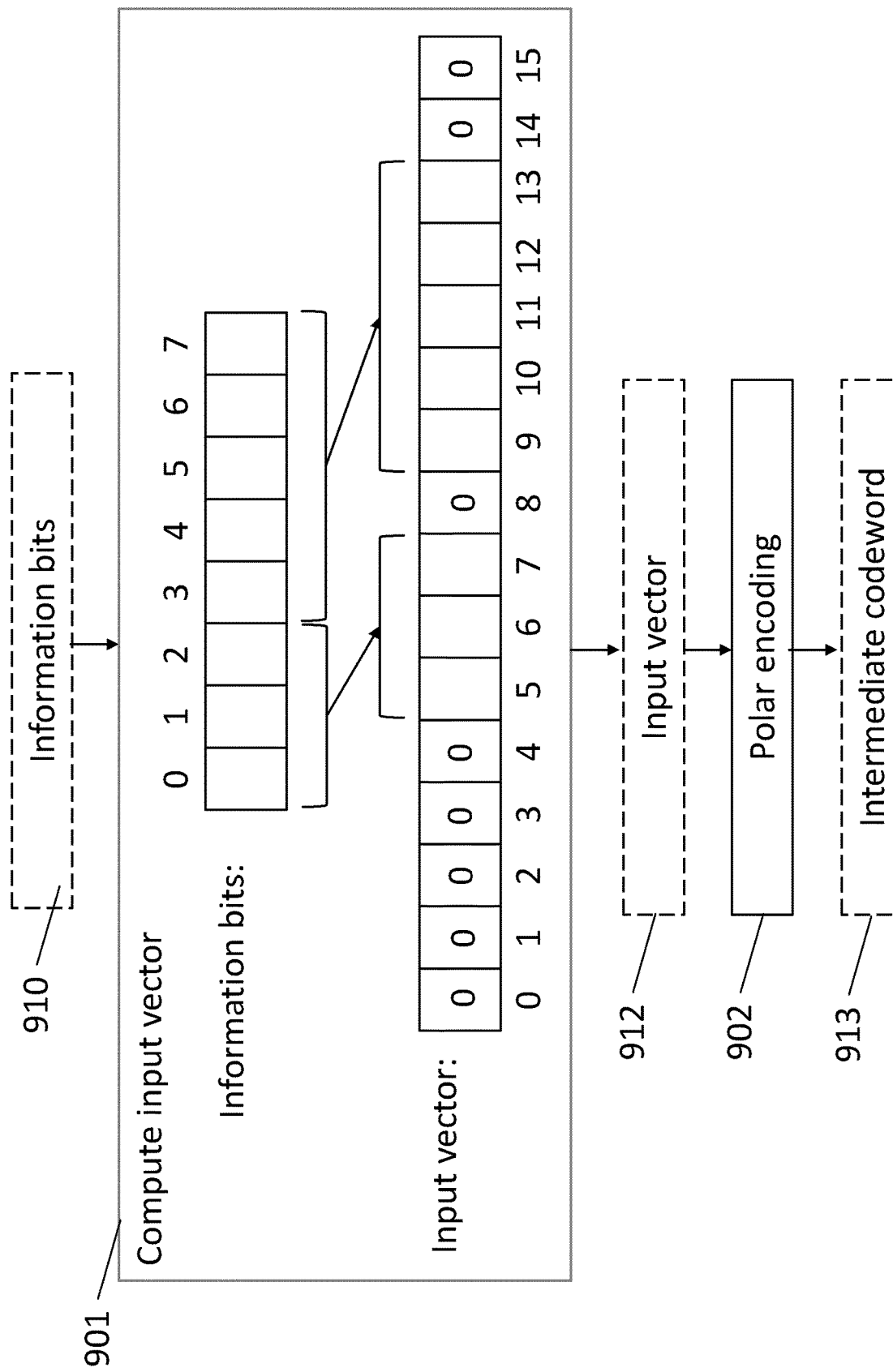
FIGS. 7A, 7B, 7C and 7D illustrate an example for an execution of steps of FIG. 2 according to an embodiment of the present invention.
Figure 7B:
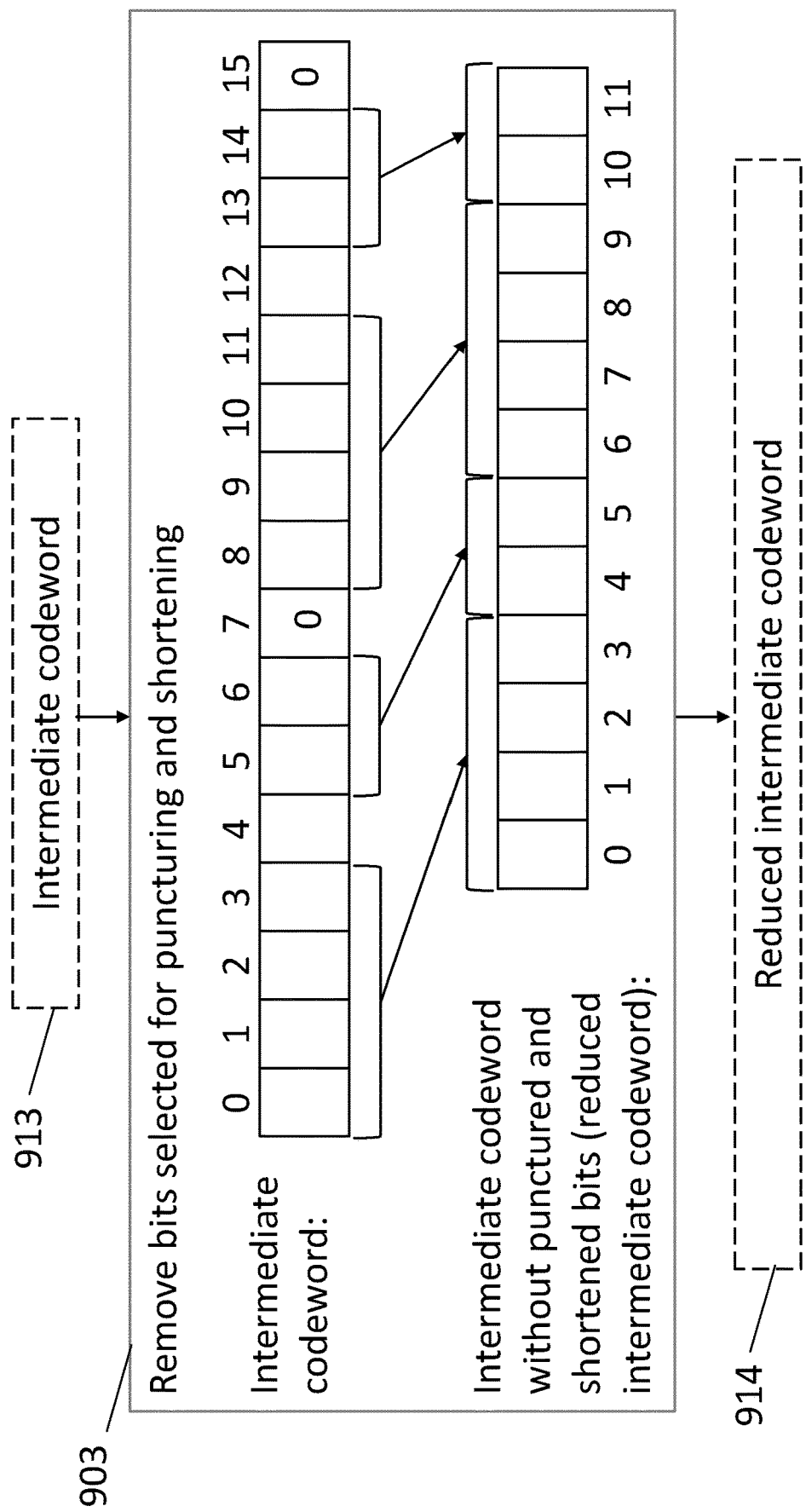
Figure 7C:
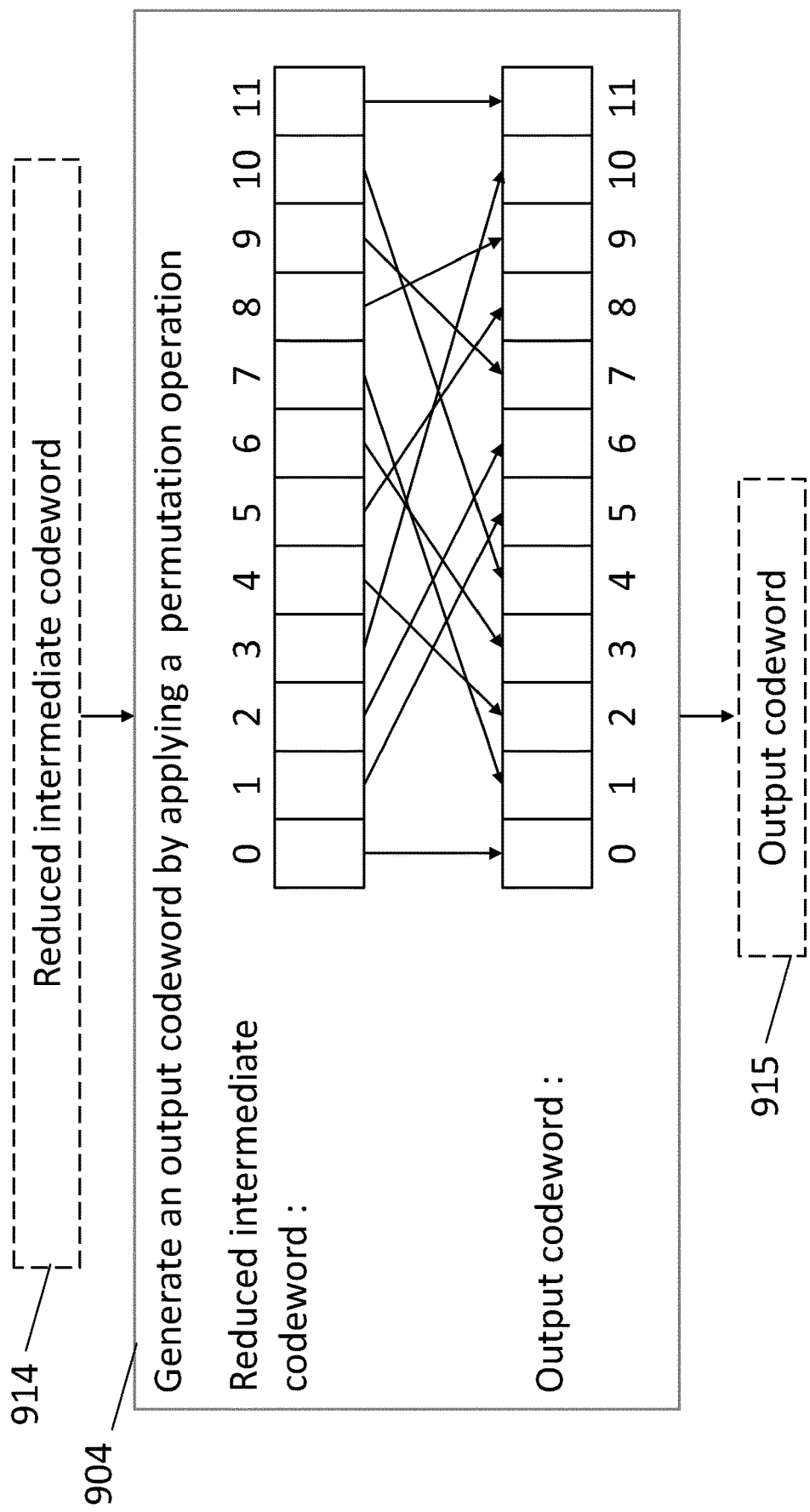
Figure 7D:
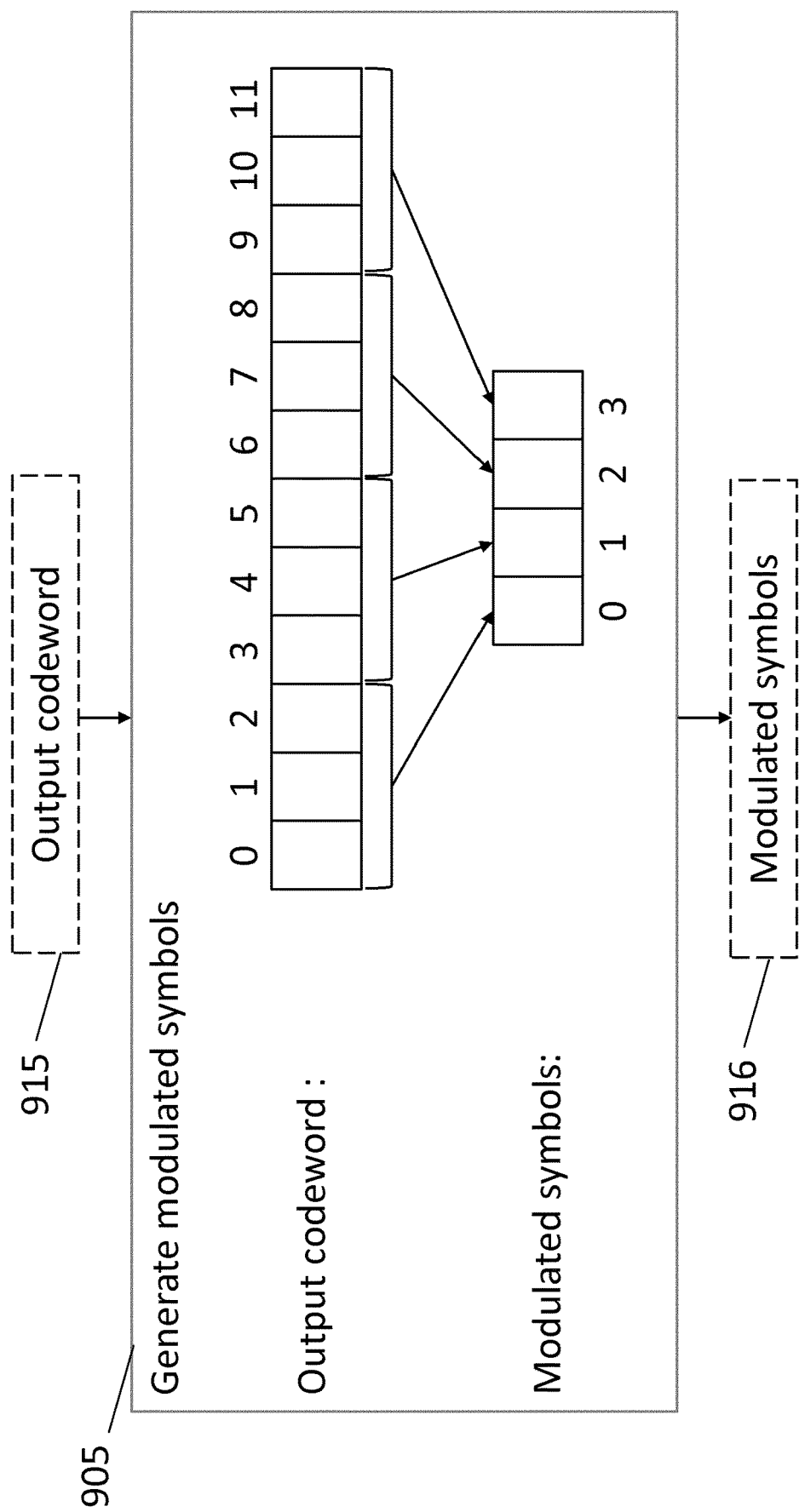
Figure 8A:
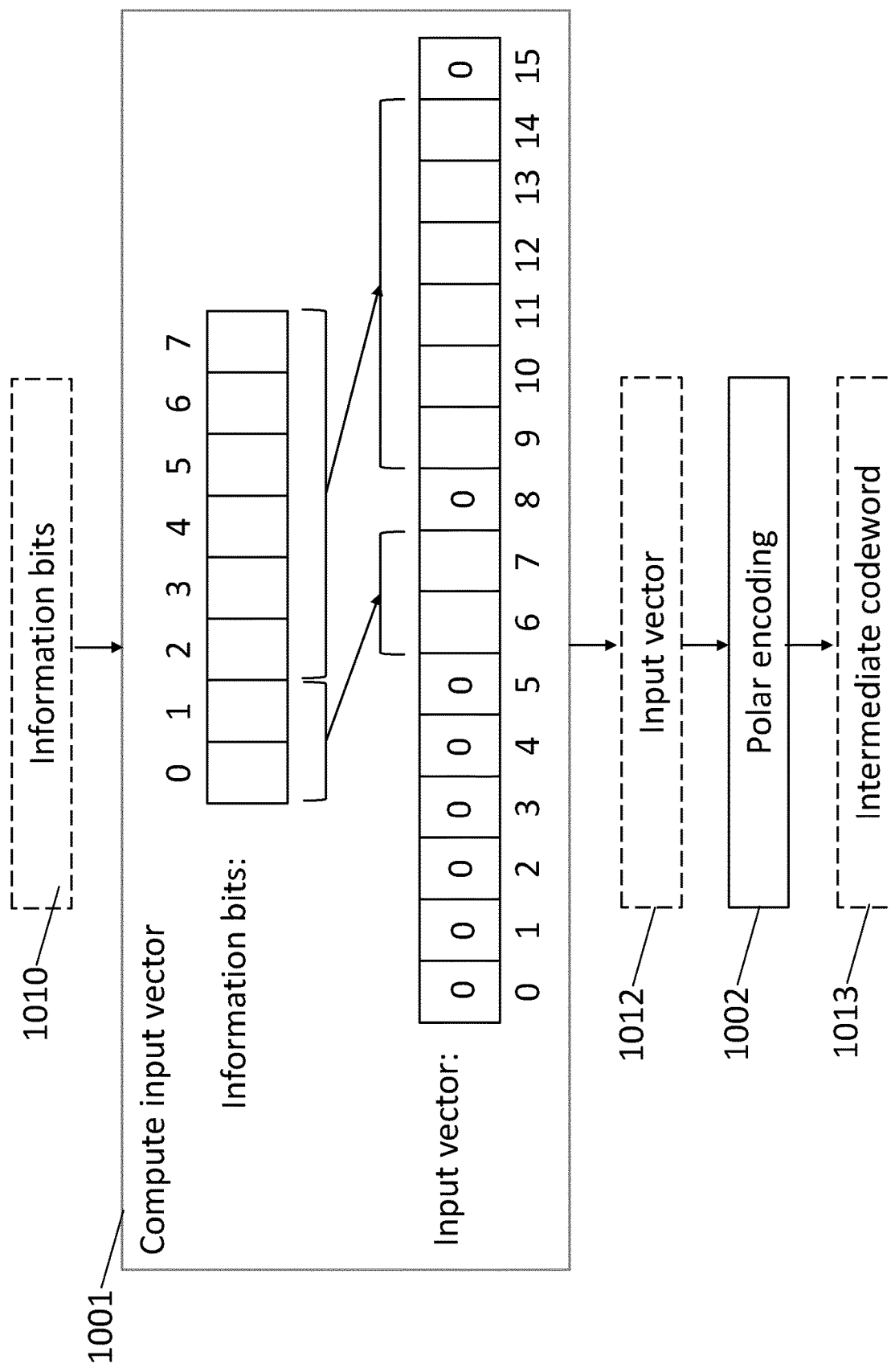
Figure 8B:
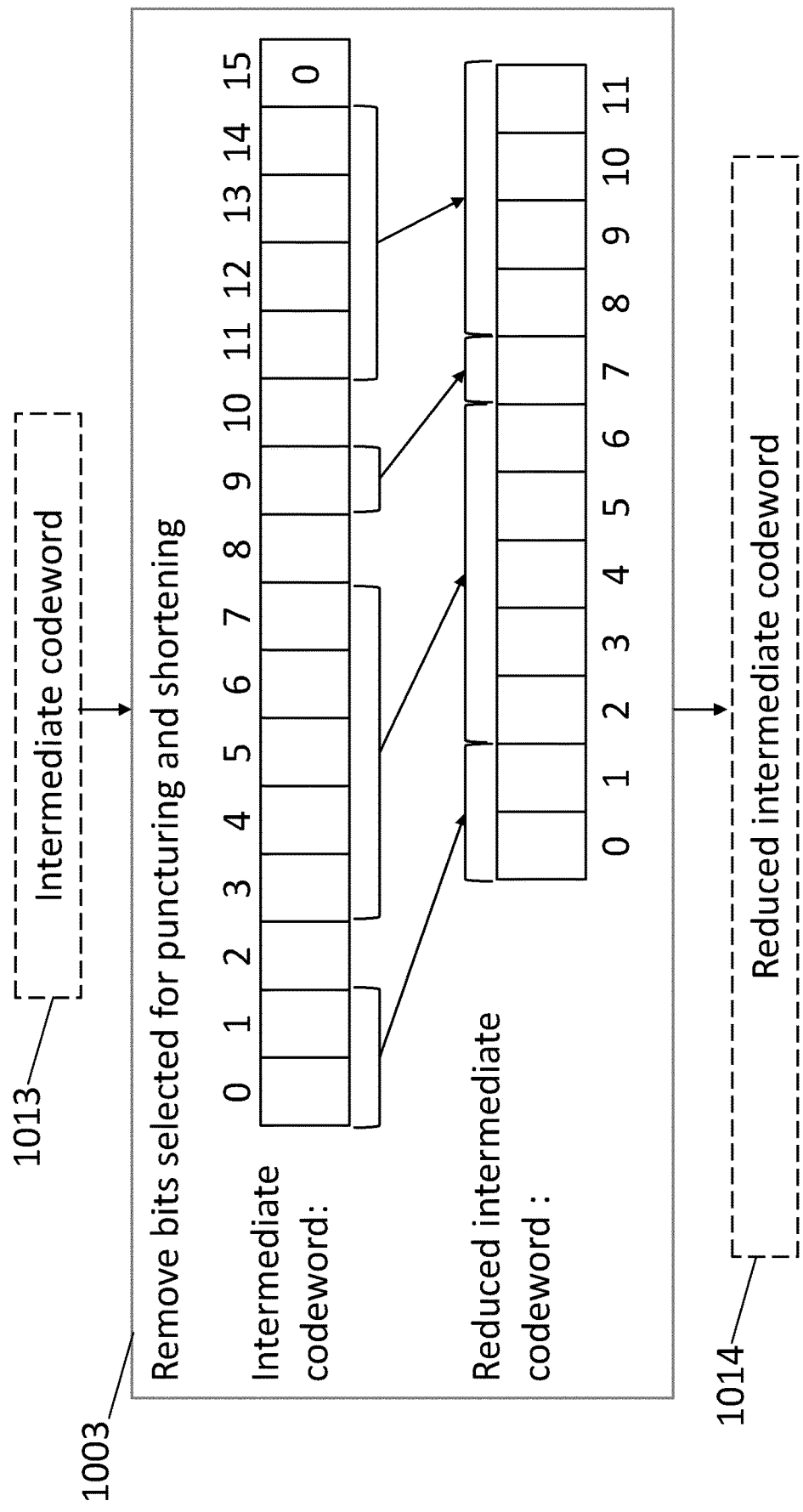
Figure 8C:
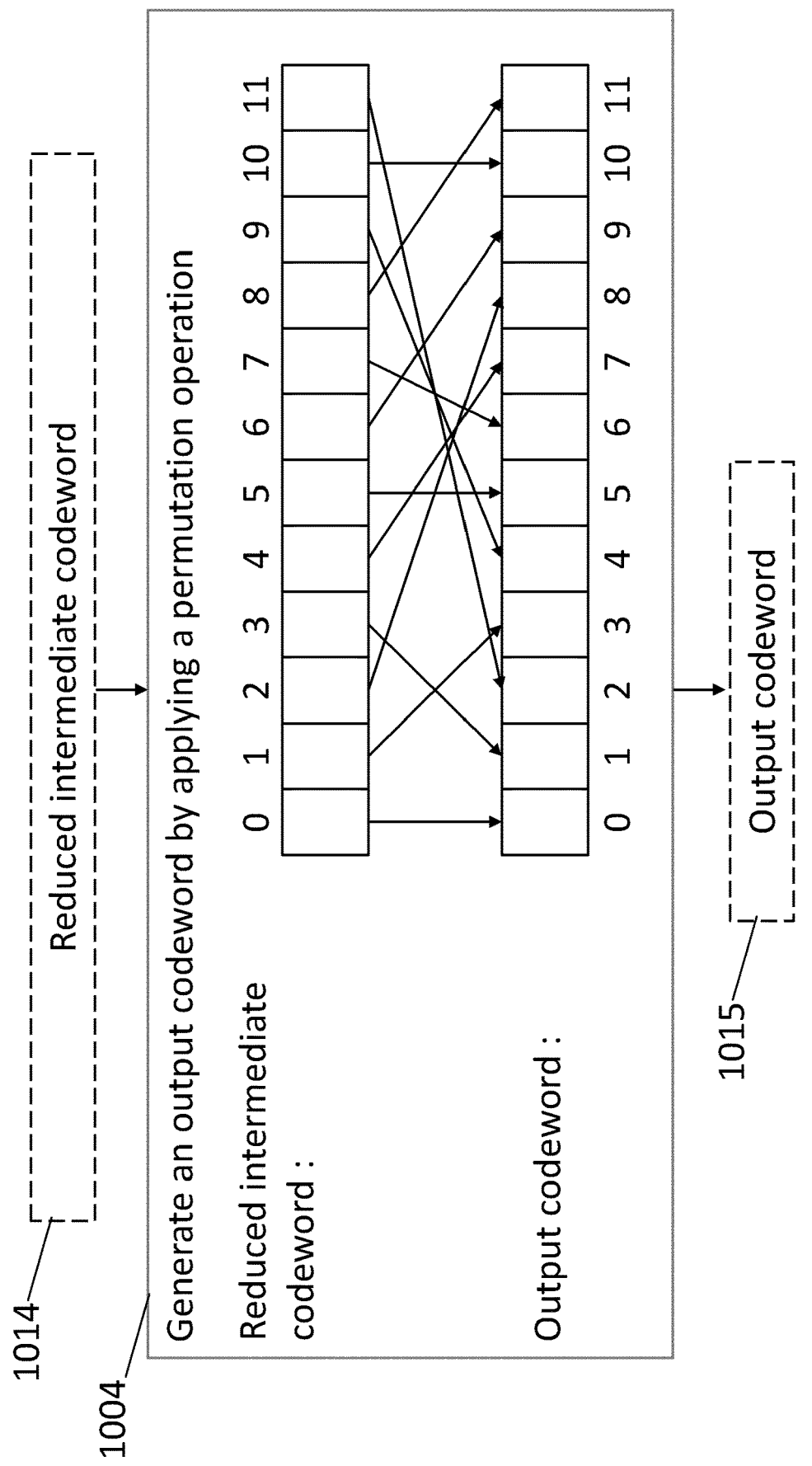

FIG. 6 shows relationships between the steps of FIGS. 2, 3, and 5 according to the embodiment of the present invention. More precisely, FIG. 6 shows results of which code design steps of FIG. 3 and results of which code extending steps of FIG. 5 specify which encoding steps of FIG. 2.

According to the present embodiment, a relationship exists between the code selecting step 405 and the input vector computing step 201, in which an input vector for the polar encoding 202 is calculated. Particularly, freezing constraints required for input vector computation step 201 are determined in step 405. More precisely, these freezing constraints are completed in sub-step 502 of step 404 by selection of additional frozen bits for a codeword pattern $S_m$ that is formed from a respective optimal inner pattern $S_\mu$.

However, only in step 405 it is determined, for which particular code C from a code set freezing constraints should be taken. The additional frozen bits determined in sub-step 502, pre-defined freezing constraints (determined in step 402) and freezing constraints induced by shortened codeword bits are incorporated and provided as freezing constraints for computation of input vector. Here, it has to be noted, that particular freezing constraints, i.e. expressions (linear combinations of information bits) intended for calculation of frozen bits within input vector, are provided for encoding device and encoding method for computation of input vector. These $(2^m-k)$ freezing constraints have been determined with regard to desired code parameters, pre-defined freezing constraints and the codeword pattern $S_m$, which is based on optimal inner pattern $S_\mu$. Observe that the number of pre-defined freezing constraints is between 0 and $(2^m-k)$, thus presence of pre-defined freezing constraints is not necessary. In view of the selected 405 code, having the desired length n and k information bits, the respective codeword pattern $S_m$ and/or the optimal inner pattern $S_\mu$, and also corresponding freezing constraints can be determined and provided for the encoding device (FIG. 1) and/or encoding method (FIG. 2), in particular, for computation 201 of input vector.

According to the present embodiment, a relationship exists between the code selecting step 405 and the step 203. Particularly, for execution of step 203 a codeword pattern is required, which is finally selected on step 405, while codeword pattern computation is performed in step 501 (sub-step of step 404). In step 501 codeword pattern $S_m$ is constructed for each inner pattern $S_\mu$ from the set of optimal inner patterns. The codeword pattern $S_m$ is used in step 203 for removing bits from the intermediate codeword that are intended for puncturing and shortening. The entries of the codeword pattern $S_m$ are bit type entries. If a bit type entry in the codeword pattern $S_m$ comprises a shortened bit type or a punctured bit type, the respective bit in the intermediate codeword that corresponds to the bit type entry is removed. Here, it has to be noted, that in view of the selected 405 code, having the desired length n and encoding k information bits, the respective codeword pattern $S_m$ can be determined and provided for the removal 203 from the intermediate codeword bits to be shortened and bits to be punctured.

According to the present embodiment, a relationship exists between the permutation pattern selecting step 406 and the step 204, in which an output codeword is generated by applying a permutation operation on the reduced intermediate codeword (i.e., intermediate codeword without punctured and shortened bits). The permutation pattern generated in step 406 is provided to the step 204, where the permutation operation is applied by use of the permutation pattern, i.e. the bits of the intermediate codeword without punctured and shortened bits are rearranged as indicated in the permutation pattern.

According to the embodiment of FIG. 6, a relationships exists between the code selecting step 405 and the execution of the selection 205 of the sequence of extension bits. The selected code is specified by freezing constraints, codeword pattern $S_m$ and permutation pattern. The codeword pattern $S_m$ is provided to steps 601 and 603, while freezing constraints are provided to the step 602 and 603, where steps 601-605 are executed to specify step 205, i.e. to compose schedule for extension bit selecting.

Additionally, in FIG. 6, a relationship has been indicated from the step 604 to the step 205, wherein in step 604 a selected optimal bit is appended to the sequence of extension bits and in step 205 the selection of extension of bits, initialized by particular values, is executed according to the schedule, which is iteratively formed by execution of step 406.

Additionally, it has to be noted that, according to an embodiment, steps shown in FIGS. 3, 4 and/or 5 are executed before the execution of the steps of FIG. 2. According to a further embodiment, the results of the computations of said steps (e.g., inner patterns, codeword patterns, freezing constraints, permutation patterns, and/or (schedules for selecting of) sequences of extension bits) are stored in a memory. The memory is implementable in a flexible way. According to an embodiment, the memory is a part of the device 100, according to another embodiment, the memory is an external memory, i.e. a memory that is external to the device 100. The steps of FIGS. 3, 4, and/or 5 may be executed with regard to different encoding settings, e.g. one or more different code parameters (n, k) and one or more different values μ. If the results of the calculations of said steps are determined in advance, then steps of FIG. 1 are specified (i.e. prepared for execution) by the necessary information (e.g., codeword patterns, freezing constraints, permutation patterns, and/or (schedules for selecting of) sequences of extension bits). In this way the efficiency of the encoding process is high.

FIGS. 7A to 7D illustrate an example for an execution of steps of FIG. 2 according to an embodiment of the present invention. The exemplary embodiment of FIGS. 7A to 7D is combinable with any of the embodiments described herein. It provides a more concrete view on the present invention based on concrete values of parameters, and any more concrete feature of the embodiment of FIGS. 7A to 7D can be incorporated accordingly in a more general embodiment such as the embodiment of FIG. 2 or any other embodiment described herein.

According to the present embodiment, an (n=12, k=8) code is constructed according to the steps of FIG. 3. The code is optimized for a 8-level pulse-amplitude modulation (PAM-8) with $2^3$ possible discrete pulse amplitudes. Thus, T=3, wherein T denotes the number of possible output codeword bit types, which is 3 in the present example. According to the present embodiment, a Gaussian channel with standard noise deviation σ=1.1367 is considered. Further, according to the present exemplary embodiment, each puncturing and shortening will be done by 2 bits. The parent code is set to be an (N=16, K=11, $d_{min}$=4) extended Bose-Chaudhuri-Hocquenghem (BCH) code, where N is the code length, K is the length of the information to be encoded, and $d_{min}$ is the minimal Hamming distance of the code. The Hamming distance denotes the number of positions, at which corresponding symbols of two strings of equal length are different. Thus, the number of pre-defined freezing constraints is equal to N−K=5. Further, according to the present embodiment, the length of the inner pattern is set to be 8, i.e. μ=3. For these parameters and settings a code is constructed by execution of steps of FIG. 3. The obtained code is specified by:

freezing constraints: $u_0$=0, $u_1$=0, $u_2$=0, $u_3$=0, $u_4$=0, $u_8$=0, $u_{14}$=0, $u_{15}$=0, where u denotes input vector. Thus, in this case freezing constraints are trivial;

codeword pattern (0 2 0 1 4 2 2 3 0 1 0 1 4 1 2 3), wherein the following bit types are expressed by the entries 0 to 4:

| | |
|---|---|
| 0 | a bit of the output codeword and particularly a less reliable bit |
| 1 | a bit of the output codeword and particularly a middle reliable bit |
| 2 | a bit of the output codeword and particularly a most reliable bit |
| 3 | shortened bit |
| 4 | punctured bit | permutation pattern (0 5 6 10 2 8 3 1 9 7 4 11), wherein i-th entry of the permutation pattern represents a position within output codeword of the i-th bit of the reduced intermediate codeword.

In step 901, an input vector is computed or generated. The step 901 corresponds to the step 201 of FIG. 2. Therefore, the above-description of step 201 applies also to step 901. In particular, an input vector is computed in step 901 (by the device 100 and, in particular, by the input vector computing entity 101) by use of a sequence of information bits 910 and freezing constraints 911. As described above, 8 freezing constraints 911 may be selected in advance in step 405 in view of the code parameters or settings such as n=12 and k=8. According to the settings, the set of information bits 910 comprises 8 information bits, enumerated from 0 to 7 in FIG. 7A. The set of frozen bits, given by freezing constraints 911, comprises also 8 bits (filled with zeros in FIG. 7A, since in this particular case freezing constraints are trivial). An input vector 912 is generated by combining the information bits 910 with the frozen bits calculated according to freezing constraints 911, wherein positions of frozen bits within input vector are also determined by freezing constraints 911, while the rest of positions provided for information bits. The resulting input vector 912 is provided to the polar encoding step 902.

In step 902, a polar encoding is executed for the received input vector 912. The step 902 corresponds to the step 202 of FIG. 2. Therefore, the above-description of step 202 applies also to step 902. In particular, an intermediate codeword 913 is generated in step 902 (by the device 100 and, in particular, by the intermediate codeword generating entity 102) by performing the polar encoding.

The resulting intermediate codeword 913 serves as input for a step 903, in which bits on positions 4 and 12, selected for puncturing, and bits on positions 7 and 15, selected for shortening, are removed from the intermediate codeword 913. The step 903 corresponds to the step 203 of FIG. 2. Therefore, the above-description of step 203 applies also to step 903. In particular, a reduced intermediate codeword (i.e., an intermediate codeword without punctured and shortened bits) is generated in step 903 (by the device 100 and, in particular, by the punctured and shortened bit removing entity 103). The removal 903 of the bits, selected for puncturing and shortening, is done according to a codeword pattern $S_m$=(0 2 0 1 4 2 2 3 0 1 0 1 4 1 2 3) arranged as described above. As described above, the codeword pattern $S_m$, generated in step 404 by the device 100 and finally selected in step 405 by the device 100. As described, the codeword pattern $S_m$ represents a sequence of bit type entries, wherein each bit type entry represents one of the following bit-types: an output codeword bit type, a shortened bit type, a punctured bit type. There are T output codeword bit types corresponding to T positions of bits within a vector being mapped on a modulated symbol. Each of the bits, removed from the intermediate codeword, corresponds to a shortened bit type entry or to a punctured bit type entry in the codeword pattern $S_m$. As described above, the determination (i.e. generation 404 and selection 405) of the codeword pattern $S_m$ is done in advance in view of the code parameters or settings such as n=12, k=8, and μ=3.

According to the present embodiment, the following codeword pattern $S_m$ comprises also reliability type specifications for the output codeword bit type. Particularly, the output codeword bit type comprises sub-types, where each sub-type corresponds to a particular position of a bit within vector of length T, being mapped on modulated symbol. According to the present embodiment, in the case of T=3, e.g. if PAM-8 is employed, the following sub-types are present for the output codeword bit type: less reliable bits, middle reliable bits, most reliable bits. The reliability of a bit is determined by calculating, for the bit, error probability at the position of respective bit. According to an embodiment, the range of possible probabilities is subdivided in T parts.

According to the present embodiment, the following codeword pattern $S_m$ is used in step 903:

(0 2 0 1 4 2 2 3 010 1 4 1 2 3), wherein the following bit types are expressed by the entries 0 to 4:

| | |
|---|---|
| 0 | a bit of the output codeword and particularly a less reliable bit |
| 1 | a bit of the output codeword and particularly a middle reliable bit |
| 2 | a bit of the output codeword and particularly a most reliable bit |
| 3 | shortened bit |
| 4 | punctured bit |

The result of step 903 is an intermediate codeword without punctured and shortened bits 914, that is, a reduced intermediate codeword.

The intermediate codeword without punctured and shortened bits 914 is used in a next step 904, in which an output codeword is generated by applying a permutation operation. The step 904 corresponds to the step 204 of FIG. 2. Therefore, the above-description of step 204 applies also to step 904. Also step 904 is executed by the device 100 and, in particular, by the permutation entity 104. For the execution of the permutation operation, a permutation pattern as described above is used. As described above, the permutation pattern is determined in advance in view of settings and code parameters such as n=12, k=8, and μ=3 (see the description of step 406). The permutation pattern may be determined by the device 100 and, particularly, by the permutation pattern selection step 406.

According to the present embodiment, the following permutation pattern, computed in step 406 for codeword pattern $S_m$=(0 2 0 1 4 2 2 3 0 1 0 1 4 1 2 3), is used:

(0 5 6 10 2 8 3 1 9 7 4 11), wherein the order or sequence in the permutation pattern represents the sequence of positions for bits of a vector (the intermediate codeword without punctured and shortened bits 914) and wherein i-th entry of the permutation pattern represents the new position of the i-th bit of the intermediate codeword without punctured and shortened bits 914. Thus, for example, the zeroth entry of the permutation pattern has the value zero or '0' respectively. This means that the zeroth bit of the intermediate codeword without punctured and shortened bits 914 does not change its position, it still remains zero. The first entry of the permutation pattern has the value five or '5' respectively. This means that the first bit of the intermediate codeword without punctured and shortened bits 914 changes its position, it is moved to the position five. The second entry of the permutation pattern has the value six or '6' respectively. This means that the second bit of the intermediate codeword without punctured and shortened bits 914 changes its position, it is moved to the position six. In this way, each entry of the permutation pattern indicates a new position of the respective bit of the intermediate codeword without punctured and shortened bits 914. The sequence of bits, obtained after the execution of the permutation according to the permutation pattern, is the output codeword 915, as described above.

The resulting output codeword 915 is provided to a step 905, in which modulated symbols 916 are generated. The modulated symbols are generated by executing bitmapping for the output codeword and for the sequence of extension bits, i.e. by mapping of binary vectors on modulated symbols. According to a further embodiment, length of the sequence of extension bits may be positive or equal to zero. In this way, an extended output codeword is generated by appending sequence of extension bits to the output codeword, and the step 915 is executed with regard to said extended output codeword. The step 905 corresponds to the step 206 of FIG. 2. Therefore, the above-description of step 206 applies also to step 905. Also step 905 is executed by the device 100 and, in particular, by the modulated symbol generating entity 106. In step 915, subsequent sub-vectors of the output codeword 915 or of the extended output codeword are mapped to modulated symbols, wherein each subsequent sub-vector consists of T bits. In this way, a sequence of modulated symbols 916 is generated, that may be transmitted. According to the present embodiment, the output codeword of length twelve is partitioned into four sub-vectors of length three, and each sub-vector is mapped to a modulated symbol. Thus, a sequence of four modulated symbols is obtained.

FIGS. 8A to 8D illustrate an example for execution of steps of FIG. 2 according to an embodiment of the present invention. The exemplary embodiment of FIGS. 8A to 8D is combinable with any of the embodiments described herein. It provides a more concrete view on the present invention based on concrete values of parameters, and any more concrete feature of the embodiment of FIGS. 8A to 8D can be incorporated accordingly in a more general embodiment such as the embodiment of FIG. 2 or any other embodiment described herein.

According to the present embodiment, an (n=12, n=8) code is constructed according to the steps of FIG. 3. The code is generated for PAM-8 with $2^3$ possible discrete pulse amplitudes. Thus, T=3. According to the present embodiment, a Gaussian channel with standard noise deviation σ=1.1328 is considered. Further, according to the present exemplary embodiment, the puncturing is executed by 3 bits, and shortening is executed by 1 bit. The parent code is set to be an (N=16, K=11, drain=4) extended Bose-Chaudhuri-Hocquenghem (BCH)-code, where N is the code length, K is the length of the information to be encoded, and $d_{min}$ is the minimal Hamming distance of the code. Further, according to the present embodiment, the length of the inner pattern is set to be 8, i.e. μ=3. For these parameters and settings a code is constructed by execution of steps of FIG. 3. The obtained code is specified by:

freezing constraints: $u_0$=0, $u_1$=0, $u_2$=0, $u_3$=0, $u_4$=0, $u_5$=0, $u_8$=0, $u_{15}$=0, where u denotes input vector. Thus, in this case freezing constraints are trivial;

codeword pattern (0 0 4 2 1 1 2 0 4 0 4 2 1 1 2 3), wherein the following bit types are expressed by the entries 0 to 4:

| | |
|---|---|
| 0 | a bit of the output codeword and particularly a less reliable bit |
| 1 | a bit of the output codeword and particularly a middle reliable bit |
| 2 | a bit of the output codeword and particularly a most reliable bit |
| 3 | shortened bit |
| 4 | punctured bit | permutation pattern (0 3 8 1 7 5 9 6 11 4 10 2), wherein i-th entry of the permutation pattern represents a position within output codeword of the i-th bit of the intermediate codeword without punctured and shortened bits.

In step 1001, an input vector in computed or generated. The step 1001 corresponds to the step 201 of FIG. 2. Therefore, the above-description of step 201 applies also to step 1001. In particular, an input vector is computed in step 1001 (by the device 100 and, in particular, by the input vector computing entity 101) by use of a sequence of information bits 1010 and freezing constraints 1011. As described above, 8 freezing constraints 1011 may be selected in advance in step 405 in view of the code parameters of settings such as n=12 and k=8. According to the settings, the set of information bits 1010 comprises 8 information bits, enumerated from 0 to 7 in FIG. 8A. The set of frozen bits, given by freezing constraints 1011, comprises also 8 bits (filled with zeros in FIG. 7A, since in this particular case freezing constraints are trivial). An input vector 1012 is generated by combining the information bits 1010 with the frozen bits calculated according to freezing constraints 1011, wherein positions of frozen bits within input vector are also determined by freezing constraints 911, while the rest of positions provided for information bits. The resulting input vector 1012 is provided to the polar encoding step 1002.

In step 1002, a polar encoding is executed for the received input vector 1012. The step 1002 corresponds to the step 202 of FIG. 2. Therefore, the above-description of step 202 applies also to step 1002. In particular, an intermediate codeword 1013 is generated in step 1002 (by the device 100 and, in particular, by the intermediate codeword generating entity 102) by performing the polar encoding.

The resulting intermediate codeword 1013 serves as input for a step 1003, in which bits on positions 2, 8 and 10, selected for puncturing, and a bit on position 15, selected for shortening, are removed from the intermediate codeword 1013. The step 1003 corresponds to the step 203 of FIG. 2. Therefore, the above-description of step 203 applies also to step 1003. In particular, an intermediate codeword without punctured and shortened bits is generated in step 1003 (by the device 100 and, in particular, by the punctured and shortened bit removing entity 103). The removal 1003 of the bits, selected for puncturing and shortening, is done according to a codeword pattern $S_m$=(0 0 4 2 1 1 2 0 4 0 4 2 1 1 2 3) arranged as described above. As described above, the codeword pattern $S_m$, generated in step 404 by the device 100 and finally selected in step 405 by the device 100. As described, the codeword pattern $S_m$ represents a sequence of bit type entries, wherein each bit type entry represents one of the following bit-types: an output codeword bit type, a shortened bit type, a punctured bit type. There are T output codeword bit types corresponding to T positions of bits within a vector being mapped on a modulated symbol. Each of the bits, removed from the intermediate codeword, corresponds to a shortened bit type entry or to a punctured bit type entry in the codeword pattern $S_m$. As described above, the determination (i.e. generation 404 and selection 405) of the codeword pattern $S_m$ is done in advance in view of the code parameters or settings such as n=12, k=8, and μ=3.

According to the present embodiment, the following codeword pattern $S_m$ comprises also reliability type specifications for the output codeword bit type. Particularly, the output codeword bit type comprises sub-types, where each sub-type corresponds to a particular position of a bit within vector of length T, being mapped on modulated symbol. According to the present embodiment, in the case of T=3, e.g. if PAM-8 is employed, the following sub-types are present for the output codeword bit type: less reliable bits, middle reliable bits, most reliable bits. The reliability of a bit is determined by calculating, for the bit, error probability at the position of respective bit. According to an embodiment, the range of possible probabilities is subdivided in T parts.

According to the present embodiment, the following codeword pattern $S_m$ is used in step 1003:
(0 0 4 2 1 1 2 0 4 0 4 2 1 1 2 3).

The result of step 1003 is an intermediate codeword without punctured and shortened bits 1014.

The intermediate codeword without punctured and shortened bits 1014 is used in a next step 1004, in which an output codeword is generated by applying a permutation operation. The step 1004 corresponds to the step 204 of FIG. 2. Therefore, the above-description of step 204 applies also to step 1004. Also step 1004 is executed by the device 100 and, in particular, by the permutation entity 104. For the execution of the permutation operation, a permutation pattern as described above is used. As described above, the permutation pattern is determined in advance in view of settings and code parameters such as n=12, k=8, and μ=3 (see the description of step 406). The permutation pattern may be determined by the device 100 and, particularly, by the permutation pattern selection step 406.

According to the present embodiment, the following permutation pattern, computed in step 406 for codeword pattern $S_m$=(0 0 4 2 1 1 2 0 4 0 4 2 1 1 2 3), is used:
(0 3 8 1 7 5 9 6 11 4 10 2),
wherein the order or sequence in the permutation pattern represents the sequence of positions for bits of a vector (the intermediate codeword without punctured and shortened bits 1014) and wherein i-th entry of the permutation pattern represents the new position of the i-th bit of the intermediate codeword without punctured and shortened bits 1014, as described with regard to FIGS. 7A to 7D above. As stated above, each entry of the permutation pattern indicates a new position of the respective bit of the intermediate codeword without punctured and shortened bits 1014. The sequence of bits, obtained after the execution of the permutation according to the permutation pattern, is the output codeword 1015, as described above.

The resulting output codeword 1015 is provided to a step 1005, in which modulated symbols 1016 are generated. The modulated symbols are generated by executing bitmapping for the output codeword and for the sequence of extension bits, i.e. by mapping of binary vectors on modulated symbols. According to a further embodiment, length of the sequence of extension bits may be positive or equal to zero. In this way, an extended output codeword is generated by appending sequence of extension bits to the output codeword, and the step 1015 is executed with regard to said extended output codeword. The step 1005 corresponds to the step 206 of FIG. 2. Therefore, the above-description of step 206 applies also to step 1005. Also step 1005 is executed by the device 100 and, in particular, by the modulated symbol generating entity 106. In step 1015, subsequent sub-vectors of the output codeword 1015 or of the extended output codeword are mapped to modulated symbols, wherein each subsequent sub-vector consists of T bits. In this way, a sequence of modulated symbols 1016 is generated, that may be transmitted. According to the present embodiment, the output codeword of length twelve is partitioned into four sub-vectors of length three, and each sub-vector is mapped to a modulated symbol. Thus, a sequence of four modulated symbols is obtained.

Figure 9A:
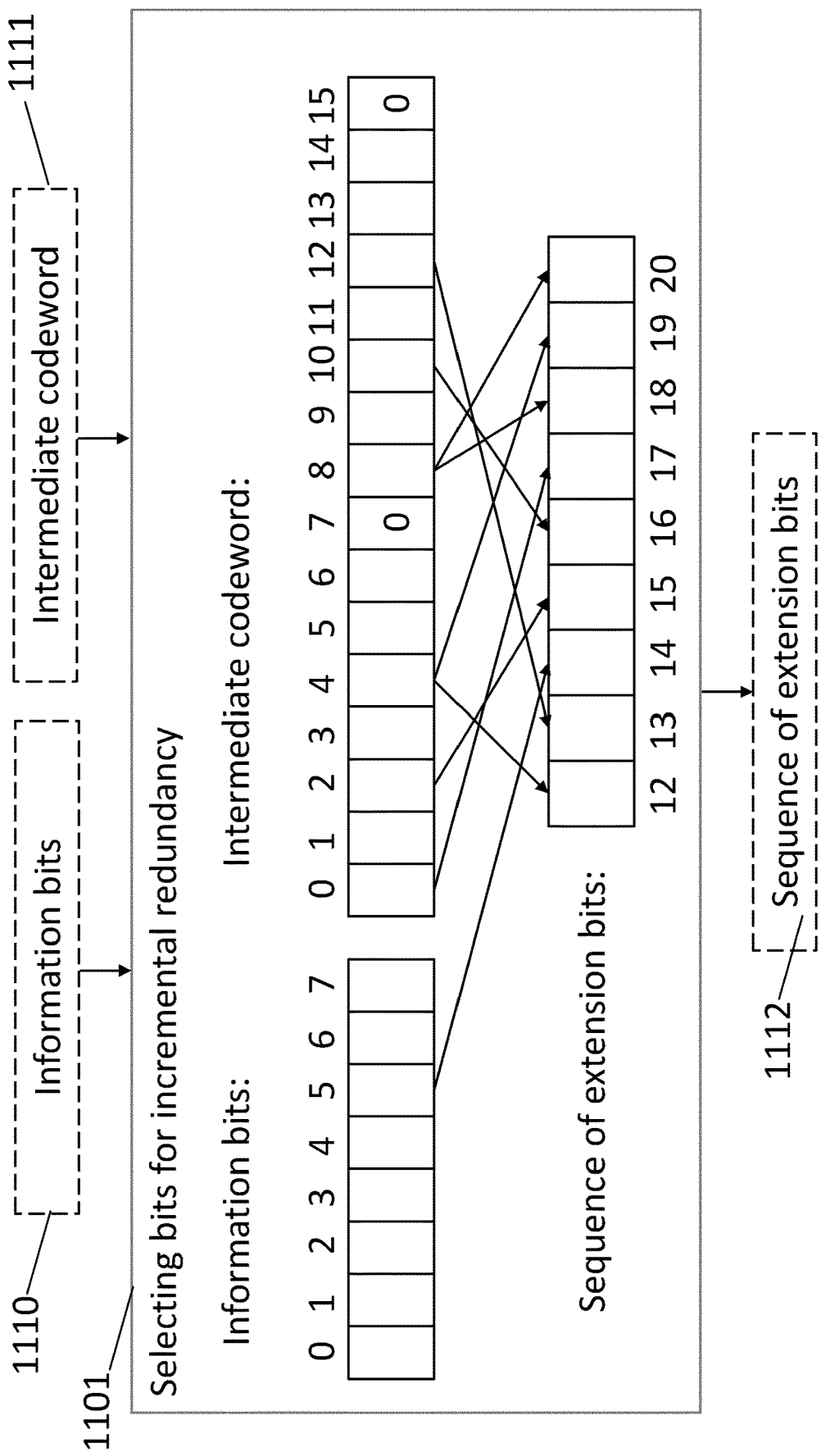
FIGS. 9A and 9B illustrate an example (continuation of the example of FIGS. 7A-7D) for an execution of steps of FIG. 2 for selecting extension bits and incorporating the selected extension bits into modulated symbols according to an embodiment of the present invention.
Figure 9B:
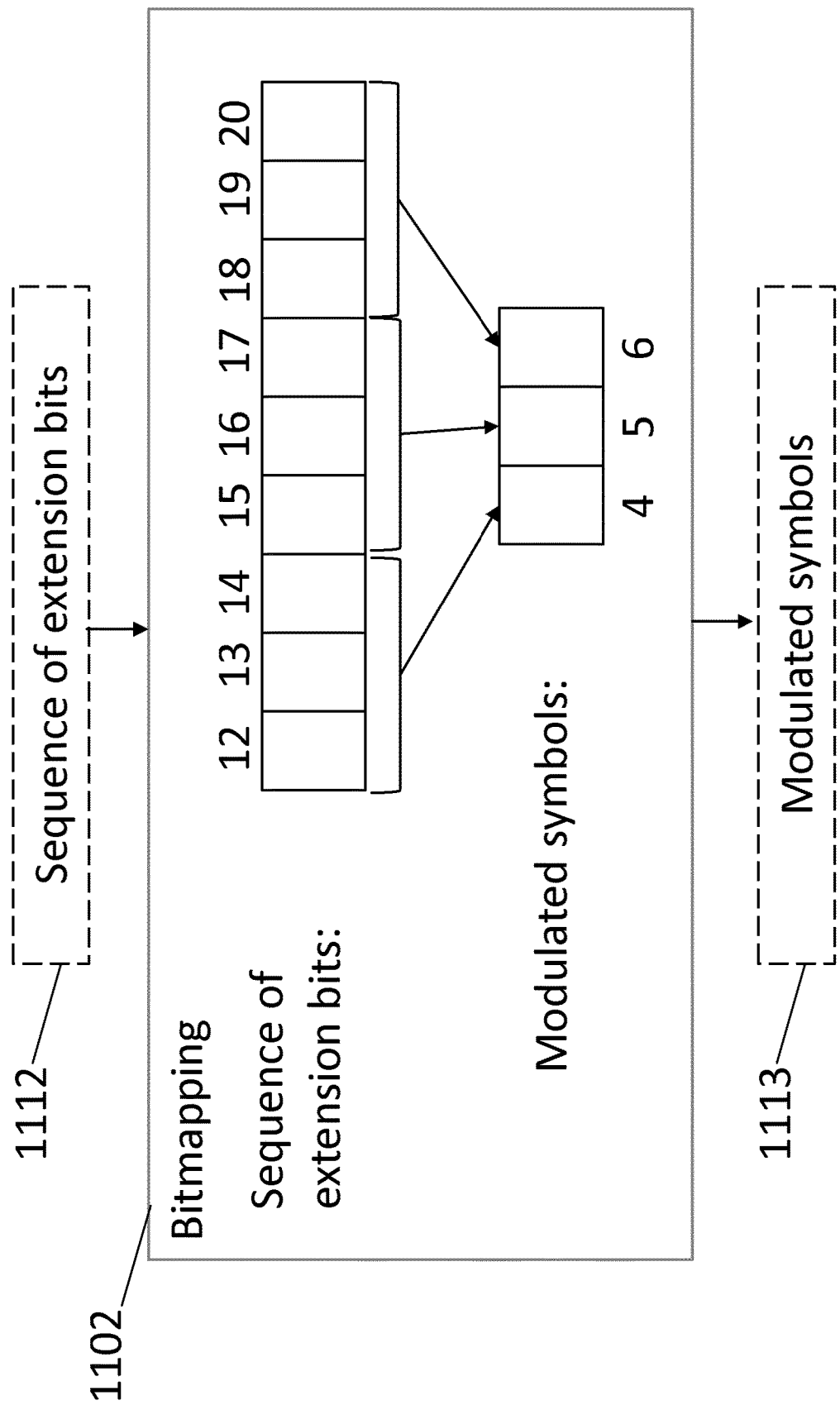

FIGS. 9A and 9B illustrate an example (continuation of the example of FIGS. 7A-7D) for an execution of steps of FIG. 2 for selecting extension bits and mapping the selected extension bits to modulated symbols according to an embodiment of the present invention. The exemplary embodiment of FIGS. 9A and 9B is combinable with any of the embodiments described herein. It provides a more concrete view on the present invention based on concrete values of parameters, and any more concrete feature of the embodiment of FIGS. 9A and 9B can be incorporated accordingly in a more general embodiment such as the embodiment of FIG. 2.

FIGS. 7A to 7D, 9A and 9B correspond to the same settings and code parameters. Thus, FIGS. 9A and 9B correspond to the code specified by freezing constraints: $u_0=0$, $u_1=0$, $u_2=0$, $u_3=0$, $u_4=0$, $u_5=0$, $u_{14}=0$, $u_{15}=0$, where u denotes input vector. Thus, in this case freezing constraints are trivial;

codeword pattern (0 2 0 1 4 2 2 3 0 1 0 1 4 1 2 3), wherein the following bit types are expressed by the entries 0 to 4:

| | |
|---|---|
| 0 | a bit of the output codeword and particularly a less reliable bit |
| 1 | a bit of the output codeword and particularly a middle reliable bit |
| 2 | a bit of the output codeword and particularly a most reliable bit |
| 3 | shortened bit |
| 4 | punctured bit | permutation pattern (0 5 6 10 2 8 3 1 9 7 4 11).

According to the present embodiment, desired number of extension bits is 9. Bits for sequence of extension bits are selected according to a schedule, which is determined by execution of steps of FIG. 5. The schedule associates position of extension bit within sequence of extension bits with a pair [key, index], where key indicates weather the extension bit is selected among information bits (key=inf) or bits of intermediate codeword (key=cw), while index shows position of the selected bit within sequence of information bits or within intermediate codeword for key=inf and key=cw, respectively. The selection of extension bits is executed by steps of FIG. 5, according to the present embodiment, in view of codeword pattern $S_4$=(0 2 0 1 4 2 2 3 0 1 0 1 4 1 2 3). The obtained schedule is the following:
([cw,4] [cw,12] [inf,5] [cw,2] [cw,10] [cw,0] [cw,8] [cw,4] [cw,8]).

According to this schedule the sequence of extension bits comprises one information bit and eight bits of intermediate codeword.

The step 1101 corresponds to the step 205 of FIG. 2, wherein bits for the sequence 1112 of extension bits are selected in step 1101. The selection is performed according to the schedule determined by steps of FIG. 5. Inputs of the step 1101 are, as described above, the information bits 1110 and the intermediate codeword 1111. According to the present embodiment values of 8 information bits 1110 and an intermediate codeword comprising a sequence of values of 16 bits are used. The selecting 1101 of the extension bits results, according to the present embodiment and schedule ([cw,4] [cw,12] [inf,5] [cw,2] [cw,10] [cw,0] [cw,8] [cw,4] [cw,8]), in a sequence of values of 9 extension bits.

The resulting sequence of extension bits 1112 is used for executing bitmapping 1101, wherein the step 1102 corresponds to the step 206 of FIG. 2. The sequence of extension bits 1112 may be used for extending of the output codeword. According to the present embodiment, all extension bits of the sequence of extension bits 1112 are used to supplement the output codeword, e.g. they are added to the output codeword or transmitted strictly after output codeword. Particularly, received noisy sequence of extension bits may be processed by a decoder only in a view of received noisy output codeword. In step 1102, bitmapping is shown with regard to the additional or extension bits 1112 for sake of clarity. The bitmapping of output codeword, corresponding to the present embodiment, is executed by step 905 of FIG. 7D. According to the present embodiment, showing exemplary a bitmapping of a sequence of additional or extension bits only, the 9 additional or extension bits are mapped to three modulated symbols 1113. The resulting modulated symbols 1113 are then may be transmitted, assuming that modulated symbols 916 were already transmitted.

Figure 10:
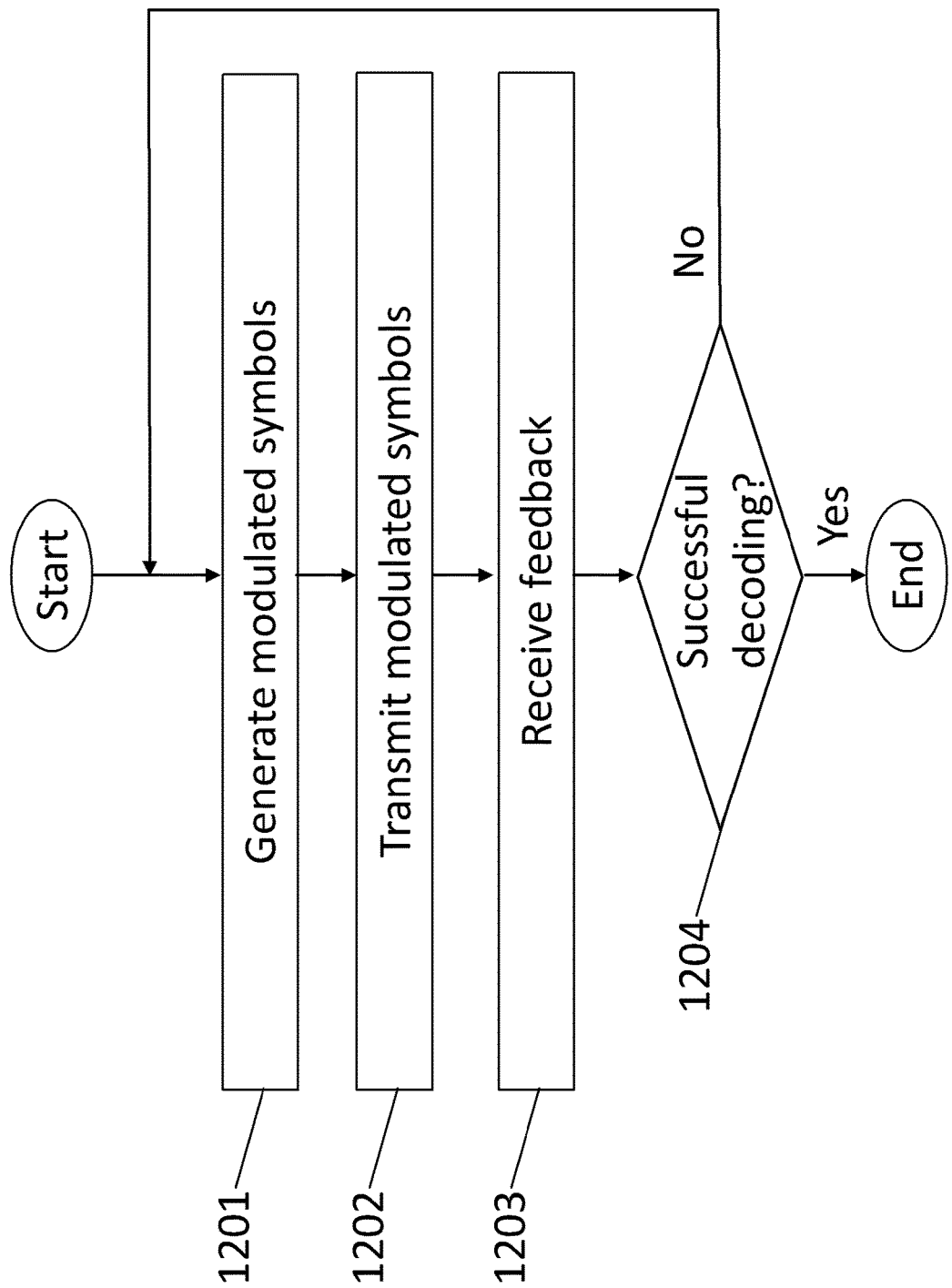
FIG. 10 shows a flow-diagram of steps implementing an incremental redundancy hybrid automatic repeat request scheme according to an embodiment of the present invention.

To ensure, that the decoding of the received noisy modulated symbols has been executed properly, according to an embodiment of the present invention, a hybrid automatic repeat request (HARQ) scheme and, particularly, an incremental redundancy (IR)-HARQ scheme is implemented. FIG. 10 shows an exemplary flow-diagram of steps implementing an IR-HARQ scheme according to an embodiment of the present invention.

In step 1201, modulated symbols are generated by applying bitmapping as explained above (see step 206 and its implementation example given by steps 905, 1005 and 1102). The bitmapping is executed in step 1201 on an output codeword and/or a part of sequence of extension bits.

In step 1202, the modulated symbols are transmitted to a further device comprising a corresponding decoder or being a decoder. The transmission 1202 is executed by the device 100. According to an embodiment, the device 100 comprises a transmitting entity that is configured to execute the transmission 1202. The further device executes a decoding of the modulated symbols, received by the further device and transmits a feedback to the device 100. The feedback indicates whether the decoding, executed by the further device, was successful or not. The decoding is considered as being successful, if decoder does not fail. Otherwise, the decoding is considered as being not successful.

Depending on received feedback message, which indicates whether the decoding was successful or not, the device 100 in step 1204 makes decision about further steps. If the decoding was successful, the transmission of said modulated symbols is terminated. If the decoding was not successful, further modulated symbols are generated in step 1201, wherein also the further steps 1202 to 1204 are executed subsequently. The transmission of the modulated symbols is executed until a successful decoding is indicated in a feedback message.

In step 1201, if repeated in response to a failed decoding of the modulated symbols, the previously selected sequence of extension bits may be used for generating further modulated symbols. Alternatively, a further or anew selection of extension bits may be executed where the existing sequence of extension bits is supplemented or selected anew. Thus, newly selected extension bits are used to generate 1201 modulated symbols to be transmitted 1202.

Thus, the present invention relates to a device and method, both arranged to execute encoding. According to the present invention, an input vector for polar encoding is computed, wherein the input vector comprises a set of information bits and a set of frozen bits, and an intermediate codeword is generated by executing a polar encoding of the input vector. Further, punctured and shortened bits are removed from the intermediate codeword, and an output codeword is generated by applying a permutation operation on the intermediate codeword without punctured and shortened bits. A sequence of extension bits is selected from the intermediate codeword bits and information bits, and modulated symbols are generated by applying bitmapping on the output codeword and on the sequence of extension bits.

The invention has been described in conjunction with various embodiments herein. However, other variations to the enclosed embodiments can be understood and effected by those skilled in the art and practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the internet or other wired or wireless telecommunication systems.

What is claimed is:

1. A device arranged to execute encoding, wherein the device includes one or more hardware processing elements configured to compute an input vector for polar encoding, wherein the input vector comprises a set of information bits and a set of frozen bits;
   execute a polar encoding of the input vector to obtain an intermediate codeword; remove punctured and reduced bits from the intermediate codeword to obtain a reduced intermediate codeword;
   apply a permutation operation on the reduced intermediate codeword to obtain an output codeword;
   select a sequence of extension bits from the intermediate codeword and from the set of information bits; and
   apply bitmapping on the output codeword and the sequence of extension bits to obtain modulated symbols; wherein the one or more hardware processing elements are configured to use a codeword pattern, wherein the codeword pattern indicates punctured bits, reduced bits and reliabilities of bits to be transmitted, and wherein the codeword pattern is optimized for successive cancellation decoding: wherein the one or more hardware processing elements are configured to determine the codeword pattern by: determining a set of optimal inner patterns with regard to a pre-set code length and with regard to the number of information bits, and
   selecting, as the codeword pattern, a pattern, which is based on an inner pattern from the set of optimal inner patterns and which minimizes decoding error probability, wherein each pattern from the set of optimal inner patterns: represents a sequence of bit type entries, wherein each bit type entry represents one of the following bit-types: output codeword bit type, reduced bit type, and punctured bit type;
   wherein sub-types of the output codeword bit type are provided for bits with different reliabilities; and provides a lower successive cancelation decoding error probability than inner patterns outside the set of optimal inner patterns.

2. The device according to claim 1, wherein the one or more hardware processing elements are configured to determine freezing constraints together with a set of frozen bits, which minimizes a successive cancellation decoding error probability for given codeword pattern.

3. The device according to claim 1, wherein the one or more hardware processing elements are configured to remove punctured and reduced bits from the intermediate codeword according to the codeword pattern.

4. The device according to claim 1, wherein the one or more hardware processing elements are configured to determine a permutation pattern based on the codeword pattern, wherein the permutation pattern is optimized with regard to decoding error probability.

5. The device according to claim 4, wherein the one or more hardware processing elements are configured to apply the permutation operation according to the permutation pattern.

6. The device according to claim 1, wherein the one or more hardware processing elements are configured to select the sequence of extension bits by:
   selecting one information bit from the sequence of information bits and selecting one codeword bit from the intermediate codeword;
   determining a first successive cancelation decoding error probability for a code, extended by the selected information bit, and determining a second successive cancelation
   decoding error probability for the code, extended by the selected codeword bit, wherein the code is specified by freezing constraints, codeword pattern and the sequence of extension bits;
   if the first successive cancelation decoding error probability is smaller than or equal to the second successive cancelation decoding error probability, adding the selected information bit to the sequence of extension bits; and
   if the second successive cancelation decoding error probability is smaller than the first successive cancelation decoding error probability, adding the selected codeword bit to the sequence of extension bits.

7. The device according to claim 6, wherein the one or more hardware processing elements are configured to:
   select, from the intermediate codeword, a codeword bit, which provides a balance of sums of codeword bit error probabilities; and/or
   select, from the sequence of information bits, an information bit that minimizes a successive cancellation decoding error probability for the code.

8. The device according to claim 6, wherein the one or more hardware processing elements are configured to repeat the execution of the steps specified in claim 6 until the sequence of extension bits comprises a pre-set number of bits.

9. The device according to claim 1, wherein the device includes a hardware element configured to transmit to another device the modulated symbols, wherein all modulated symbols, obtained from the output codeword, are transmitted.

10. The device according to claim 9, wherein the device includes a hardware element configured to receive from the another device a feedback on the transmission of the modulated symbols, wherein the feedback indicates one of the following: a successful decoding of the modulated symbols, and a failed decoding of the modulated symbols.

11. The device according to claim 10, wherein, if the feedback indicates a faded decoding of received noisy modulated symbols, the device is configured to:
generate further modulated symbols by applying bitmapping to further bits of sequence of extension bits, wherein the further bits are bits determined by executing the selecting of the extension bits; and
transmit to the another device the further modulated symbols.

12. A method arranged to execute encoding, wherein the method comprises the steps, implemented in a device comprising one or more hardware processing elements, of:
computing an input vector for polar encoding, wherein the input vector comprises a set of information bits and a set of frozen bits;
executing polar encoding of the input vector to obtain an intermediate codeword; removing punctured and reduced bits from the intermediate codeword to obtain a reduced intermediate codeword;
applying a permutation operation on the reduced intermediate codeword to obtain an output codeword;
selecting a sequence of extension bits from the intermediate codeword and from the information bits; and
applying bitmapping on the output codeword and the sequence of extension bits, to obtain modulated symbols; wherein the one or more hardware processing elements are configured to use a codeword pattern, wherein the codeword pattern indicates punctured bits, reduced bits and reliabilities of bits to be transmitted, and wherein the codeword pattern is optimized for successive cancellation decoding:
wherein the one or more hardware processing elements are configured to determine the codeword pattern by:
determining a set of optimal inner patterns with regard to a pre-set code length and with regard to the number of information bits, and
selecting, as the codeword pattern, a pattern, which is based on an inner pattern from the set of optimal inner patterns and which minimizes decoding error probability wherein each pattern from the set of optimal inner patterns:
represents a sequence of bit type entries, wherein each bit type entry represents one of the following bit-types: output codeword bit type, reduced bit type, and punctured bit type, wherein sub-types of the output codeword bit type are provided for bits with different reliabilities; and
provides a lower successive cancelation decoding error probability than inner patterns outside the set of optimal inner patterns.

13. A non-transitory computer-readable recording medium storing a computer readable program code, which when executed by a computing device causes the computing device to execute the steps of the method of claim 12.

14. The method according to claim 13, further comprising receiving from the another device a feedback on the transmission of the modulated symbols, wherein the feedback indicates one of the following: a successful decoding of the modulated symbols, and a failed decoding of the modulated symbols.

15. The method according to claim 12, further comprising transmitting to another device the modulated symbols, wherein all modulated symbols, obtained from the output codeword, are transmitted.

16. The method according to claim 15, wherein, if the feedback indicates a failed decoding of received noisy modulated symbols, the method further comprises:
generating further modulated symbols by applying bitmapping to further bits of sequence of extension bits, wherein the further bits are bits determined by executing the selecting of the extension bits; and
transmitting to the another device the further modulated symbols.

* * * * *